(12) United States Patent
Inoue et al.

(10) Patent No.: US 6,686,108 B2
(45) Date of Patent: Feb. 3, 2004

(54) FABRICATION METHOD OF SEMICONDUCTOR INTEGRATED CIRCUIT DEVICE

(75) Inventors: Osamu Inoue, Ome (JP); Norio Hasegawa, Hinode (JP); Shuji Ikeda, Koganei (JP)

(73) Assignee: Renesas Technology Corporation, Tokyo (JP)

( * ) Notice: Subject to any disclaimer, the term of this patent is extended or adjusted under 35 U.S.C. 154(b) by 140 days.

(21) Appl. No.: 09/964,341

(22) Filed: Sep. 28, 2001

(65) Prior Publication Data

US 2002/0045134 A1 Apr. 18, 2002

(30) Foreign Application Priority Data

Oct. 13, 2000 (JP) ........................................ 2000-313513

(51) Int. Cl.[7] .............................. G03F 9/00; G03C 5/00
(52) U.S. Cl. ........................... 430/30; 430/22; 430/311
(58) Field of Search ................................. 430/5, 22, 30, 430/311

(56) References Cited

U.S. PATENT DOCUMENTS 6,335,130 B1 * 1/2002 Chen et al. ..................... 430/5
6,482,555 B2 * 11/2002 Chen et al. ..................... 430/5

FOREIGN PATENT DOCUMENTS

| JP | 5630129 | 3/1981 |
| JP | 5922050 | 2/1984 |

* cited by examiner

*Primary Examiner*—Christopher G. Young
(74) *Attorney, Agent, or Firm*—Antonelli, Terry, Stout & Kraus, LLP

(57) ABSTRACT

On the occasion of the aligning process to transfer a predetermined pattern to a semiconductor wafer by irradiating a photoresist on the semiconductor wafer with an aligning laser beam of the modified lighting via a photomask MK, the photomask MK allocating, to provide periodicity, the main apertures to transfer the predetermined pattern as the apertures formed by removing a part of the half-tone film on the mask substrate and the auxiliary apertures not resolved on the semiconductor wafer as the apertures formed by removing a part of the half-tone film is used to improve the resolution of the pattern.

27 Claims, 25 Drawing Sheets

FABRICATION METHOD OF SEMICONDUCTOR INTEGRATED CIRCUIT DEVICE

BACKGROUND OF THE INVENTION

The present invention relates to a method of fabricating a semiconductor integrated circuit device (hereinafter called a semiconductor IC device); and, more particularly, the invention relates to a technique that can be effectively applied to a photolithography process (hereinafter, simply referred to as lithography) for the transfer of a predetermined pattern to a semiconductor wafer (hereinafter, simply referred to as wafer) using a photomask (hereinafter, simply referred to as mask) in the manufacture of a semiconductor IC device.

In the manufacture of a semiconductor IC device, a lithography technique is used as a method of transferring a fine pattern to a wafer. In the lithography technique, a projection aligner is mainly used to form a device pattern by transferring the pattern of a mask mounted on the projection aligner onto a wafer. This lithography technique is described, for example, in Japanese Unexamined Patent Publication No. 135402/1999. Namely, this reference discloses a technique for allocating an auxiliary aperture to such a degree as to not be resolved in the periphery of a main aperture provided to form a contact hole of a memory device in the mask and for utilizing a modified lighting or the like for the exposing process.

However, the inventors of the present invention have found that the above-referenced lithography technique has the following inherent problems. Namely, with improvement in the scale-down, the margin for depth of focus decreases, and, thereby, the resolution of the patterns is lowered. Moreover, when a coarse region wherein patterns are discretely allocated on the same layer and a fine region wherein patterns are closely allocated coexist, a difference is generated in the pattern sizes of such coarse region and fine region. Moreover, the size accuracy of patterns existing at the boundary between the coarse region and fine region is deteriorated.

SUMMARY OF THE INVENTION

Therefore, an object of the present invention is to provide a technique to improve the resolution of patterns.

Moreover, another object of the present invention is to provide a technique to reduce the size difference between patterns in the coarse region and those in the fine region.

Still another object of the present invention is to provide a technique to improve the size accuracy of patterns existing at the boundary of the coarse region and fine region.

The abovementioned objects and other objects and novel characteristics of the present invention will become more apparent from the following more detailed description of the present invention and the accompanying drawings.

The summary of the representative aspects and features of the invention disclosed in the present specification will be briefly explained as follows.

Namely, the present invention utilizes, on the occasion of the aligning process, to transfer a predetermined pattern to a semiconductor wafer by irradiating a photoresist film on the semiconductor wafer with an aligning light beam of a modified lighting (that is, off-axis illumination; hereinafter referred to as modified lighting) via a photomask, a photomask allocating, to provide periodicity, main apertures to transfer the predetermined pattern, which are apertures formed by removing a part of a half-tone film on a mask substrate, and auxiliary apertures not resolved on a semiconductor wafer, which are apertures formed by removing a part of the half-tone film.

Moreover, the present invention utilizes a photomask in which main apertures, that are used to transfer the predetermined pattern and that are formed as apertures by removing a part of a light shielding film on the mask substrate, and auxiliary apertures, that are not resolved on the semiconductor wafer and that are the apertures formed by removing a part of the light shielding film, are allocated to provide periodicity on the occasion of the aligning process to transfer the predetermined pattern to the semiconductor wafer by irradiating the photoresist film on the semiconductor wafer with an aligning laser beam of the modified lighting via the photomask, with a view toward realizing a proximity correction of the predetermined main apertures among the main apertures, predetermined auxiliary apertures among the auxiliary apertures or to both apertures.

Moreover, the present invention utilizes, on the occasion of aligning process, to transfer a predetermined pattern to a semiconductor wafer by irradiating a photoresist film on the semiconductor wafer with an aligning laser beam of a modified lighting via a photomask, the photomask thereof allocating, to provide periodicity, main apertures to transfer the predetermined pattern, which are apertures formed by removing a part of the light shielding film on the mask substrate, and auxiliary apertures not resolved on the semiconductor wafer, which are apertures formed by removing a part of the light shielding film, and also forming the auxiliary aperture allocation region as a region broadened an integer number of times the pitch of the predetermined pattern with reference to the main apertures.

Moreover, the present invention discloses a structure in which the coarse region, where the predetermined relatively coarse pattern is allocated, and the fine region, where the predetermined relatively fine pattern is allocated, coexist in the same layer in the predetermined region of the semiconductor wafer.

DETAILED DESCRIPTION OF THE INVENTION

Figure 1:
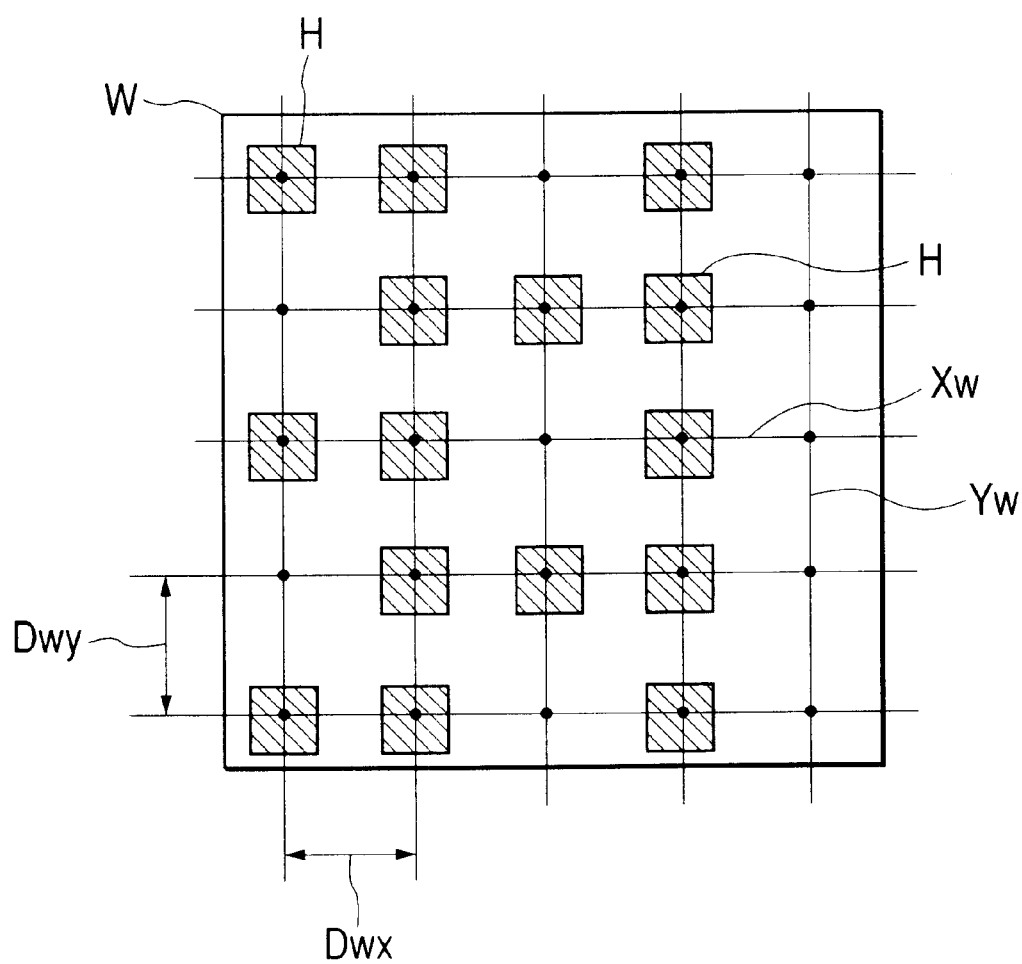
FIG. 1 is a plan view of a portion of a semiconductor IC device representing an embodiment of the present invention.

Prior to a detailed explanation of the present invention, the terminology used in the present specification will be explained.

1. Mask (optical mask):

A mask a pattern to shield a light beam and a pattern to change the phase of a light beam formed on the mask substrate. The mask also includes a reticle on which a pattern having a size equal to several times the actual size is formed. The term "on the mask substrate" includes the upper surface of the mask substrate, the internal region approximated to the upper surface or the space above the upper surface of the mask substrate (allocation on the other substrate approximated to the upper surface is also included). The first main surface of a mask refers to the pattern surface where a pattern for shielding the light beam and a pattern for changing the phase of the light beam are formed, and the second main surface of mask refers to the surface on the opposite side of the mask relative to the first main surface. A usual mask (binary mask) refers to an ordinary photomask where a mask pattern is formed on the substrate with a pattern to shield a light beam and a pattern to transmit the light beam.

2. Main aperture:

A main aperture is an aperture pattern on the mask or the like corresponding to the pattern of a device to be actually transferred to the wafer.

3. Auxiliary aperture:

In general, an auxiliary aperture is an aperture pattern on the mask not forming an independent image corresponding to the aperture pattern when projected on the wafer.

4. Half-tone region, half-tone film:

The terms refer to a region or film having a low light transmitting coefficient not sensitizing the photoresist film by itself. This region or film can be classified into an in-phase and inverse-phase (inverted) region or film. In general, these regions and films have a light transmitting coefficient of 3% to 15%, but it is also possible to obtain a half-tone region or film having a light transmitting coefficient as high as 20% or more through coexistence of a light shielding region or the like.

5. "Light transmitting region", "light transmitting pattern", "transparent region", "transparent film" may be used when such region, pattern, film or condition has an optical characteristic which allows a light beam of 60% or more among those radiating the region to pass. In general, those allowing a light beam of 90% or more to pass are used. On the other hand, "light shielding region", "light shielding pattern", "light shielding film" or "light shielding" may be used when such region, pattern, film or condition has the optical characteristic which allows a light beam of less than 40% among those radiating the region to pass. In general, those allowing a light beam of less than several percentages to 30% (optical transmitting coefficient is almost 0% (typically, 1% or less)) to pass are used. From the functional viewpoint, a light transmitting region can be defined as a region having a light transmitting coefficient lower than that of a half-tone region.

6. Ultraviolet rays:

In the semiconductor field, ultraviolet rays are electromagnetic rays having a wavelength from 400 nm to 50 nm or less in the short wavelength range. The wavelength region longer than 300 nm is called the near ultraviolet ray region, the wavelength region shorter than above region is called the far ultraviolet ray region and the wavelength region of 200 nm or less is called the outside region of the vacuum ultraviolet ray region. As a light source, the i-ray of a silver arc lamp (wavelength: 365 nm), KrF excimer laser (wavelength: 248 nm), ArF (wavelength: 193 nm) and $F_2$ (wavelength: 157 nm) excimer laser or the like may be used.

7. Wafer or semiconductor substrate refers to a silicon single crystal substrate (in general, a flat disc type substrate), sapphire substrate, glass substrate, other insulation/non-insulation or semiconductor substrate or the like, and the composite substrate of these substrates to be used for the manufacture of a semiconductor IC device. Moreover, a semiconductor IC device in accordance with the present invention also includes, unless otherwise particularly specified clearly, a semiconductor IC device fabricated on other types of insulated substrate, such as a glass material like TFT (Thin-Film-Transistor) and STN (Super-Twisted-Nematic) liquid crystal or the like, in addition to those fabricated on a semiconductor or insulated substrate, such as a silicon wafer or sapphire substrate or the like.

8. Scanning exposure:

The term refers to an exposing (aligning) method used to transfer the circuit pattern on the photomask to a desired area on the semiconductor wafer by relatively and continuously moving (scanning) the aligning belt like a narrow slit in the orthogonal direction (or may be diagonally) to the longitudinal direction of the slit for the semiconductor wafer and photomask (or reticle, the photomask in the present invention indicates a wide concept including the reticle).

9. Step and scan exposure:

This term refers to an aligning method for aligning the entire part of the wafer to be aligned through a combination of scanning exposure and stepping exposure. This aligning method refers to an aligning concept lower than the scanning exposure.

10. Step and repeat exposure:

This term refers to an aligning method for transferring a circuit pattern on a mask to a desired area on the wafer by repeatedly stepping the wafer relative to the projected image of the circuit pattern on the mask.

11. Ordinary lighting refers to a non-modified lighting in which the light intensity distribution is comparatively uniform.

12. Modified lighting (off-axis illumination) refers to a lighting system where the light intensity at the center is lowered and includes an ultra-high resolution technique based on inclined lighting, ring-belt lighting, multi-pole lighting, such as four-pole lighting and five-pole lighting or the like, and a pupil filter equivalent to such multi-pole lighting.

13. Resolution:

Pattern size can be expressed through standardization with the numerical aperture NA of a projection lens and the aligning wavelength $\lambda$. Since the resolution R is expressed as $R=K1 \cdot \lambda/NA$, it may be used through conversion. However, since depth of focus D is expressed as $D=K2 \cdot \lambda/(NA)^2$, the depth of focus is different. K1 and K2 are constants.

14. Transfer pattern:

A transfer pattern is a pattern transferred on the wafer using a mask. In practice, this involves the photoresist pattern and the pattern actually formed on the wafer using the photoresist pattern as a mask.

15. The photoresist pattern is a film pattern that has been obtained by patterning a photosensitive organic film using a lithography method. This pattern includes only a resist film having no aperture for the relevant part.

16. Hole pattern:

This term refers to a fine pattern of a contact hole and through hole or the like having a two-dimensional size similar to or smaller than the aligning wavelength on the wafer. In general, this pattern has a square shape, or a rectangular shape near to a square shape, or an octagonal shape on the mask, but it is often circular shape on the wafer.

17. Line pattern:

A line pattern is a pattern of wirings or the like having a belt type shape extending in a predetermined direction.

In the description of the preferred embodiments, the present invention will be explained through division of the subject matter into a plurality of sections or embodiments whenever required, but unless otherwise indicated clearly, these are related with each other and one is in the relationship as a modification, example, detail or complementary explanation of the others.

Moreover, when the description refers to a number of elements (including number, numerical value, quantity, range or the like), unless otherwise clearly indicated and restricted to the particular number from the viewpoint of the principle being described, such number is not limited to the particular number and may be larger or smaller than the particular number.

Moreover, in the following preferred embodiments, the structural elements (including an element step or the like) is not of course essential, unless otherwise specified clearly and thought of as clearly essential from the viewpoint of the principle being described.

In the same manner, in the following preferred embodiments, when the present specification refers to a shape and positional relationship of structural elements, such shape and positional relationship are substantially similar to or resemble each other, unless otherwise clearly specified or thought of as different from the viewpoint of the principle being described. It can also be adapted to the numerical value and range.

In addition, like elements having similar functions are designated with like reference numerals, and an explanation thereof will not be repeated in the present specification.

Moreover, even in the plan views that schematically illustrate a mask or data in the drawings used to illustrate the preferred embodiments, the half-tone regions (or film) and the desired patterns are hatched to assure easier understanding of the drawings.

The preferred embodiments of the present invention will be explained in detail with reference to the accompanying drawings.

Embodiment 1

In the manufacture of a semiconductor IC device, the margin of aligning will be lowered in some cases due to the scale-down at the time of forming a hole pattern as a result of coexistence of the coarse region and fine region in the same layer.

Therefore, in this embodiment, for example, a main aperture for transfer of a hole pattern and an auxiliary aperture not resolved by itself in the periphery of the main aperture are allocated at the intersecting point of the virtual lines which cross each other on the mask. Moreover, the main aperture and auxiliary aperture are formed by removing a part of the half-tone film on the mask. In addition, as the lighting for the aligning, a modified lighting having a usefulness in the periodic pattern is utilized. Thereby, since the depth of focus and aligning allowance can be improved in both the coarse region and the fine region, the resolution of the pattern can be improved. Moreover, the use of a half-tone film reduces a variation in size resulting from deviation of the focus. In addition, a pattern size difference resulting from coarse or fine pattern conditions can also be reduced. Furthermore, in the case of a mask using a light shielding film, the auxiliary aperture of the mask is sometimes resolved on the wafer for a predetermined exposure, but it is possible that the auxiliary aperture of the mask is not resolved on the wafer by utilizing the half-tone film.

FIG. 1 illustrates an example of the allocation of the hole patterns (hatched portions). H in the fine region on the wafer W. The hole patterns H are allocated at intersecting points of the virtual lines Xw and Yw. The virtual lines Xw, Yw are orthogonal with each other. The pitches Dwx, Dwy of the virtual lines Xw, Yw are equal, and these virtual lines Xw and Yw are allocated to have a pitch equal to that of the integrated circuit patterns.

Figure 2A:
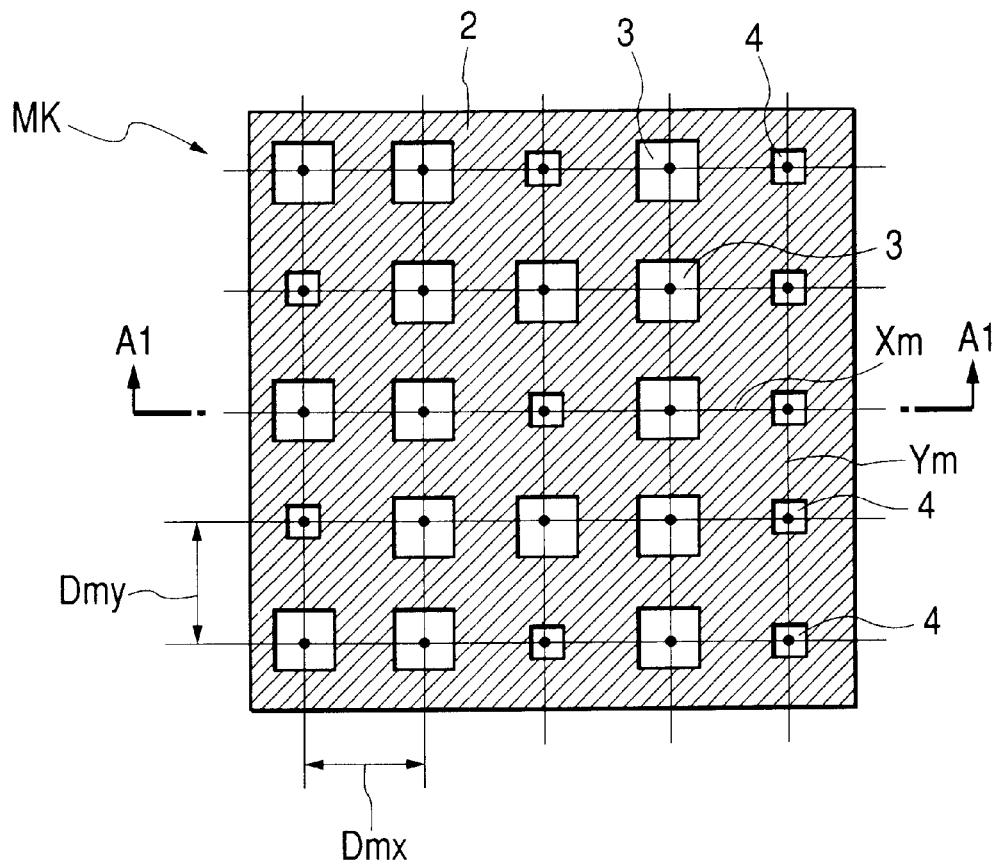
FIGS. 2(a) is a plan view of a portion of a photomask used to transfer a pattern of the semiconductor IC device of FIG. 1.
Figure 2B:
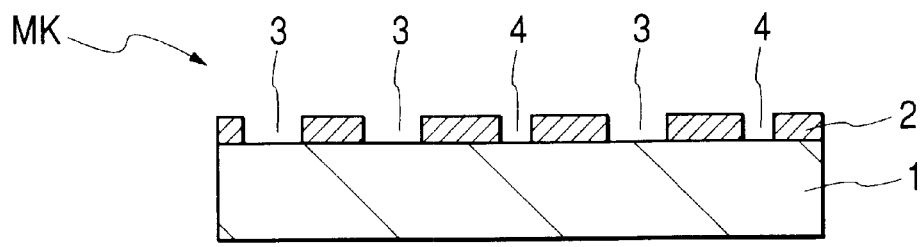
FIG. 2(b) is a cross-sectional view taken along the line A1—A1 of FIG. 2(a).

FIGS. 2(a) and 2(b) illustrate an example of the mask MK used to transfer the hole pattern of FIG. 1. FIG. 2(a) is a plan view of a portion of the mask MK, and FIG. 2(b) is cross-sectional view taken along the line A1—A1 of FIG. 2(a). This mask MK is a reticle for transferring the original image of an integrated circuit pattern having a size, for example, of 1 to 10 times the actual size to the wafer through a demagnifying projection optical system or the like. A mask substrate 1 of this mask MK is formed, for example, of a transparent synthetic quartz glass substrate or the like having a thickness of about 6 mm formed in the square plane. On the main surface of the mask substrate 1, a half-tone film (hatched area) 2 is deposited. The main apertures 3 and the auxiliary apertures 4 are formed by removing parts of the half-tone film 2. The main apertures 3 and auxiliary apertures 4 are allocated at the intersecting points of the virtual lines (first and second virtual lines) Xm, Ym, and these are regularly allocated in the condition to have a periodicity in total. The virtual lines Xm, Ym are orthogonal with each other. The pitches Dmx, Dmy of the virtual lines Xm, Ym are equal and are about 1 to 10 times the pitches Dwx, Dwy of the virtual lines Xw, Yw on the wafer. The main aperture 3 is an aperture pattern to transfer the hole pattern H. The auxiliary aperture 4 is an aperture pattern not resolved on the wafer, and its size on the plane is relatively smaller than the size on the plane of the main aperture 3. The light beam having passed such main aperture 3 and auxiliary aperture 4 and the light beam having passed the half-tone film 2 have a phase difference of 180 degrees between them. At the time of aligning, using such a mask MK, a modified lighting is used as the light source. As the aligning method, any one of the scanning alignment, step and scan alignment and step and repeat alignment may be selected as desired.

Figure 3:
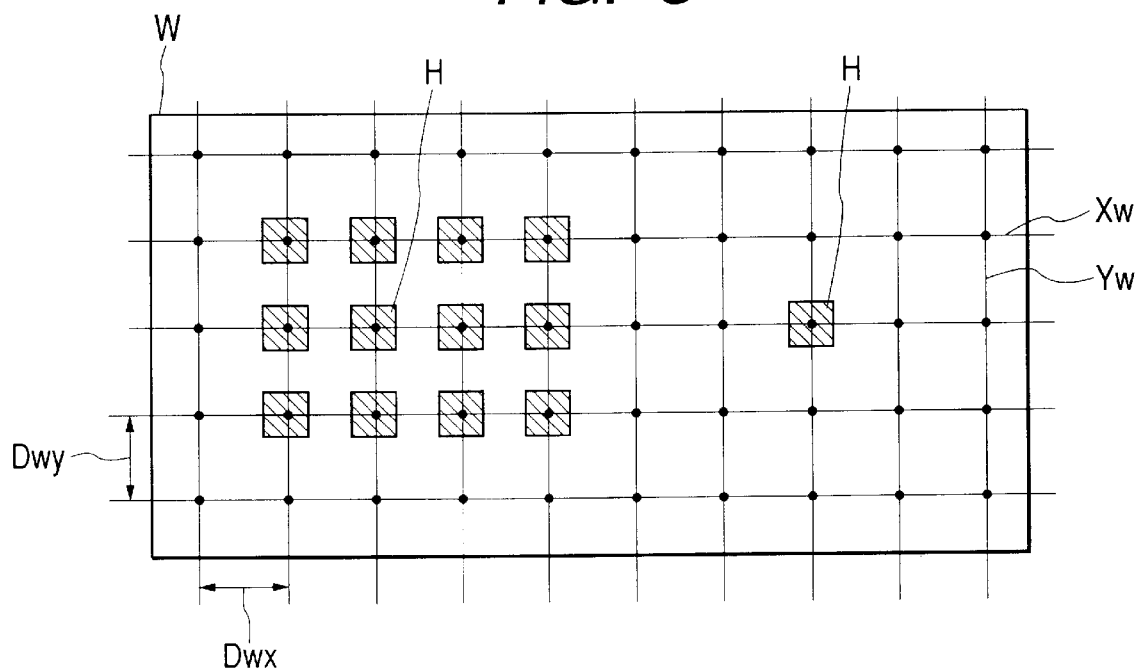
FIG. 3 is a plan view of a portion of the semiconductor IC device representing an embodiment of the present invention.

FIG. 3 illustrates an example of allocation of coarse and fine hole patterns on the wafer W. For example, in a semiconductor IC device in which there is coexistence of a memory circuit, such as a DRAM (Dynamic Random Access Memory) or the like, and a logic circuit, and in a semiconductor IC device including CMIS (Complementary MIS)-logic, the coarse region and fine region co-exist in some cases on the hole patterns of the same layer. FIG. 3 illustrates an example of such a condition. The left side of FIG. 3 is the fine region where the hole patterns H are allocated closely, while the right side of FIG. 3 shows the coarse region where the hole pattern H is allocated coarsely. The allocation condition of the hole patterns H is identical to that explained above. The size of the hole pattern H is, for example, about 0.16×0.16 $\mu$m. The pitch of the hole patterns H (namely, the pitches Dwx, Dwy of the virtual lines Xw, Yw) is, for example, about 0.32 $\mu$m.

Figure 4A:
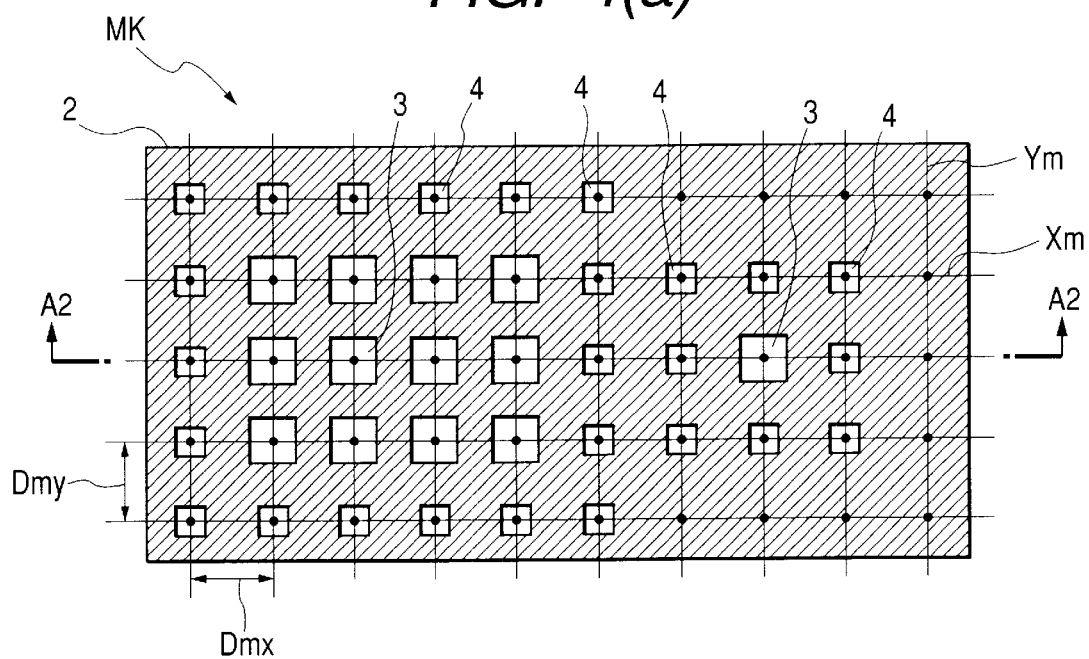
FIG. 4(a) is a plan view of a portion of the photomask used to transfer a pattern of the semiconductor IC device of FIG. 3.
Figure 4B:
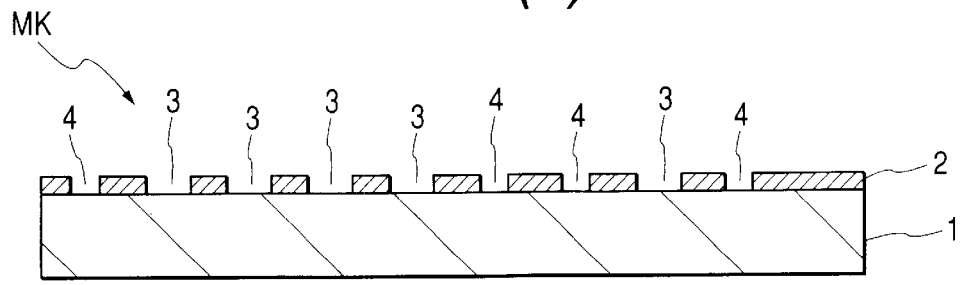
FIG. 4(b) is a cross-sectional view taken along the line A2—A2 of FIG. 4(a).

FIGS. 4(a) and 4(b) illustrate an example of the mask MK used to transfer the hole patterns H of FIG. 3. FIG. 4(a) is a plan view of a portion of the mask MK, while FIG. 4(b) is a cross-sectional view taken along the line A2—A2 of FIG. 4(a). The light transmitting coefficient of the half-tone film 2 is set, for example, to 3% to 20%, 7% to 20% or 10 to 20%. In this embodiment, the light transmitting coefficient is set, for example, to 7%. As explained above, the main apertures 3 form an aperture pattern used to transfer the hole patterns H. The auxiliary apertures 4 in the fine region are allocated in a manner such that the center thereof is located at the intersecting points of the virtual lines Xm, Ym which surround the area of the main apertures 3. In this embodiment, a positive bias is applied to the size of the main aperture 3 in both fine and coarse regions to increase light beam intensity at the time of alignment, and, thereby, the size converted on the wafer of the main aperture is set, for example, to about 200 nm×200 nm. Moreover, the auxiliary apertures 4 are set, for example, to about 140 nm×140 nm so that they are not resolved at the time of alignment.

Next, an example of the method for manufacturing a semiconductor IC device utilizing the mask MK of FIG. 4(a) will be explained with reference to FIGS. 5(a) to 8(b). FIGS. 5(b), 6(b), 7(b) and 8(b) are cross-sectional views taken along the line A3—A3 of FIGS. 5(a), 6(a), 7(a) and 8(a), respectively. Here, an example of forming a contact hole as the hole pattern will be explained.

Figure 5A:
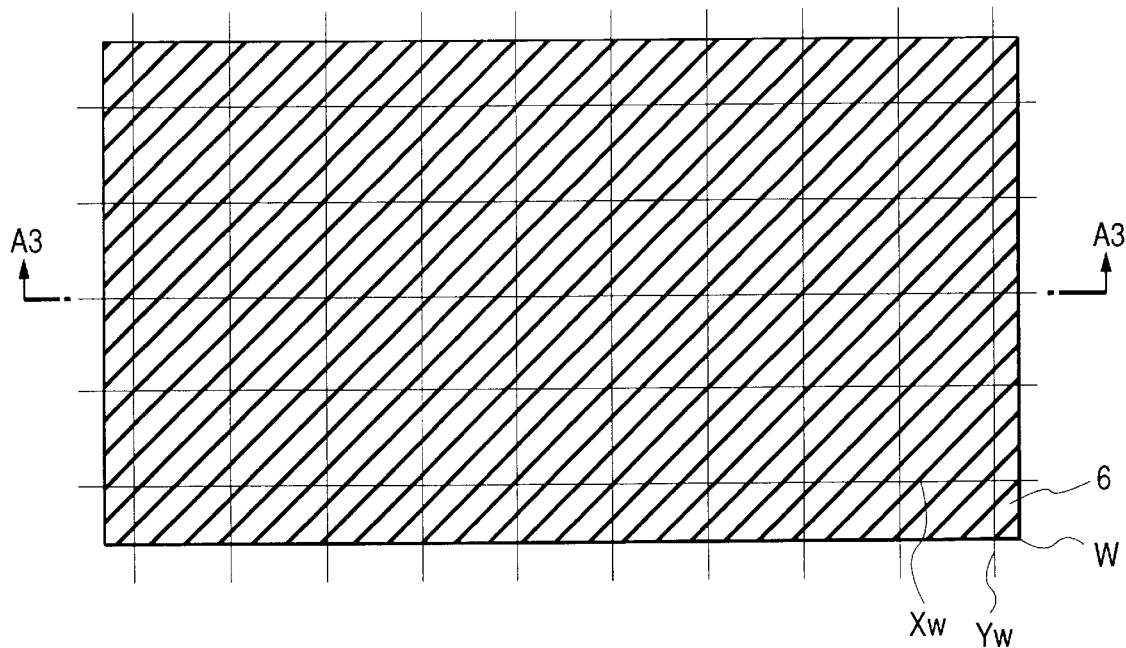
FIG. 5(a) is a plan view of a portion of the semiconductor IC device during a step in the manufacture thereof using the photomask of FIG. 4(a).
Figure 5B:
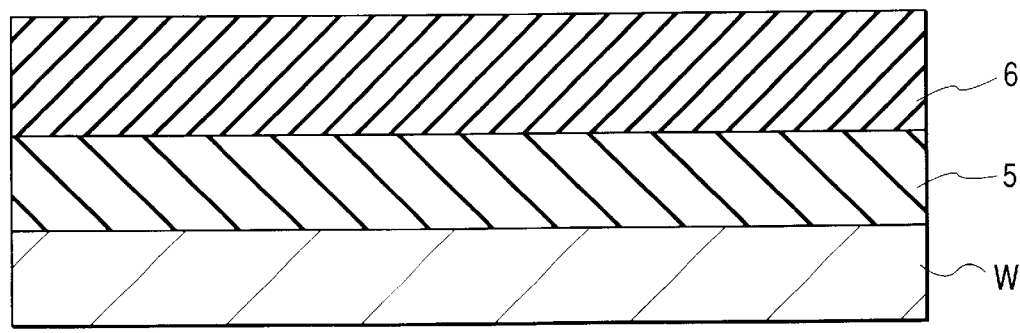
FIG. 5(b) is a cross-sectional view taken along the line A3—A3 of FIG. 5(a).

First, as illustrated in FIGS. 5(a) and 5(b), the wafer W is formed, for example, of a silicon single crystal, and an interlayer insulation film 5 formed, for example, of a silicon oxide or the like is deposited on the main plane thereof (an element forming plane where elements are formed). On this interlayer insulation film 5, a photoresist film 6 is deposited. The aligning process is executed for such a wafer W using the mask MK of FIG. 4(a). In this case, the modified lighting is used as the light source for the alignment. Thereby, a pattern of mask MK (pattern of the main aperture) is transferred to the photoresist film 6.

Figure 6A:
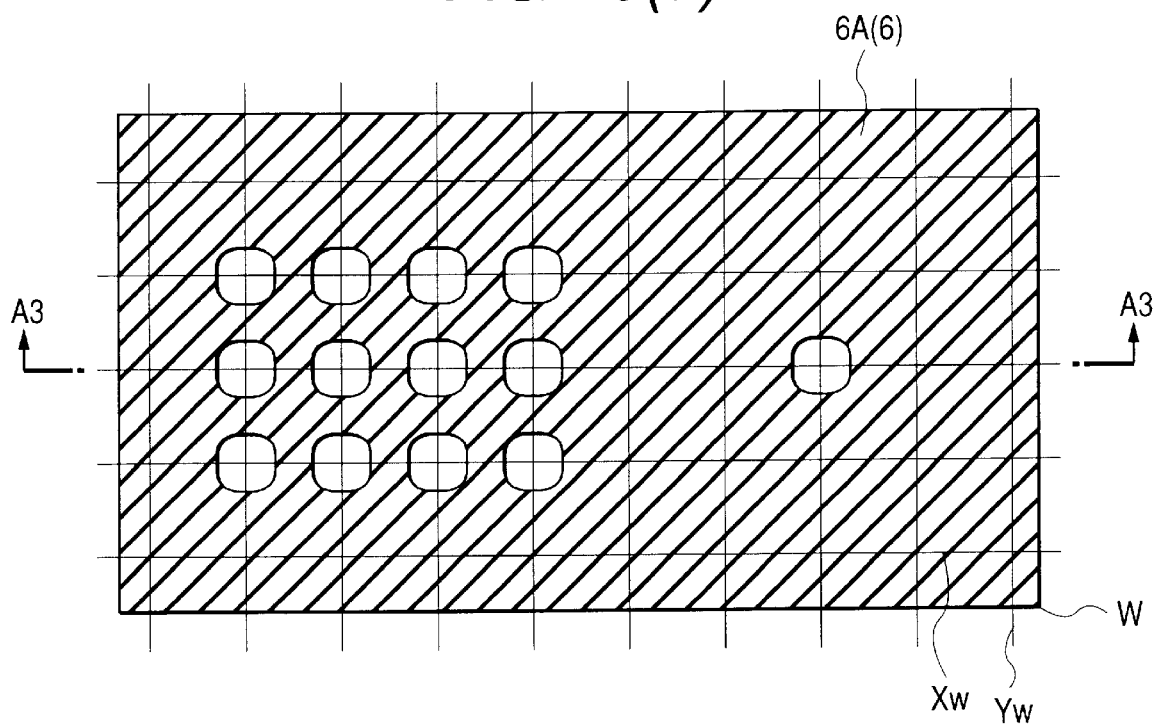
FIG. 6(a) is a plan view of a portion of the semiconductor IC device during a manufacture thereof following the step of FIG. 5(a).
Figure 6B:
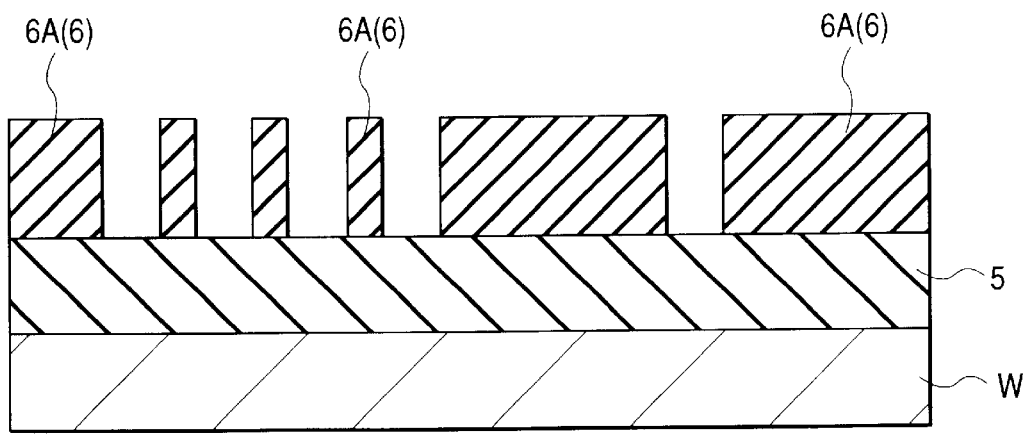
FIG. 6(b) is a cross-sectional view taken along the line A3—A3 of FIG. 6(a).

Subsequently, a photoresist pattern 6A is formed as illustrated in FIG. 6(a) by carrying out a developing process or the like on the wafer W. The photoresist pattern 6A is formed in a manner such that the photoresist film 6 is selectively removed to expose a part of the upper surface of the interlayer insulation film 5 in the contact hole forming region, while the other part remains covered with the photoresist pattern 6A. The shape of the contract hole forming region where the interlayer insulation film 5 is exposed in the photoresist pattern 6A is, for example, almost circular.

Figure 7A:
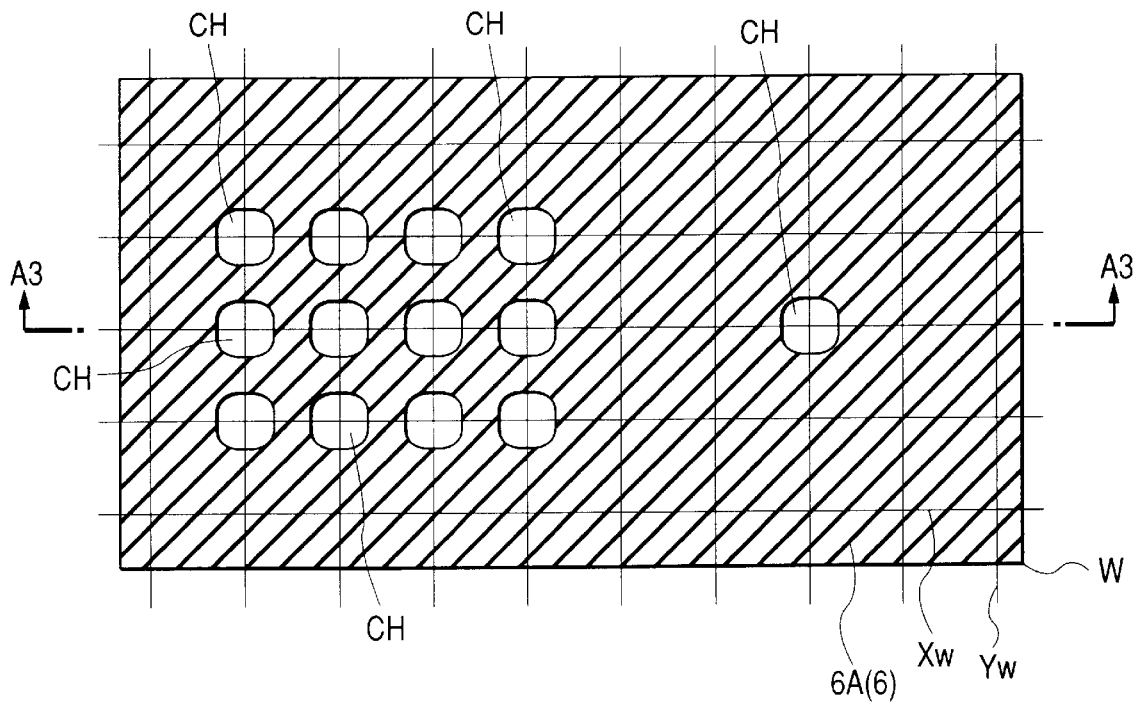
FIG. 7(a) is a plan view of a portion of the semiconductor IC device during a step in the manufacture thereof following the step of FIG. 6(a).
Figure 7B:
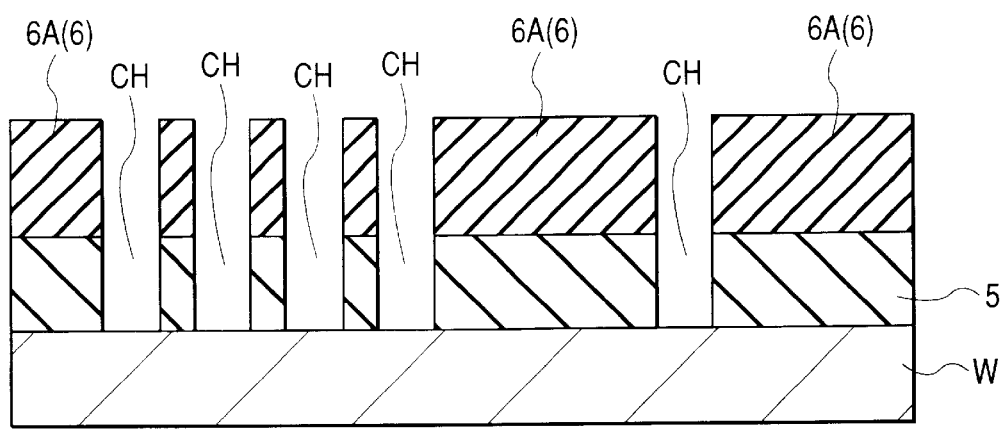
FIG. 7(b) is a cross-sectional view taken along the line A3—A3 of FIG. 7(a).
Figure 8A:
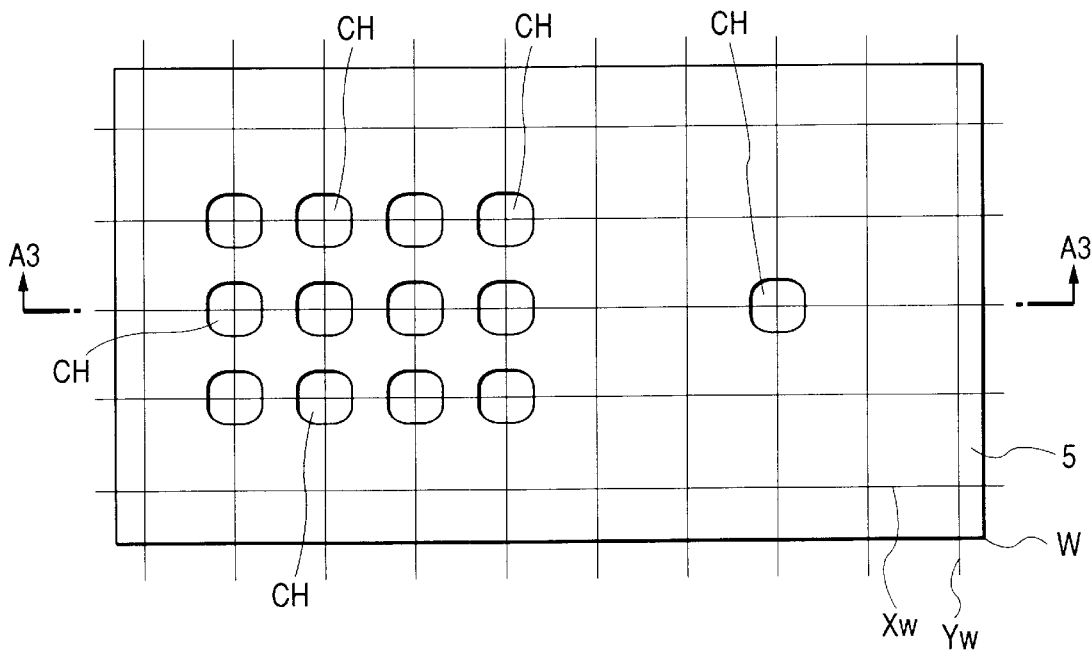
FIG. 8(a) is a plan view of a portion of the semiconductor IC device during a step in the manufacture thereof following the step of FIG. 7(a).
Figure 8B:
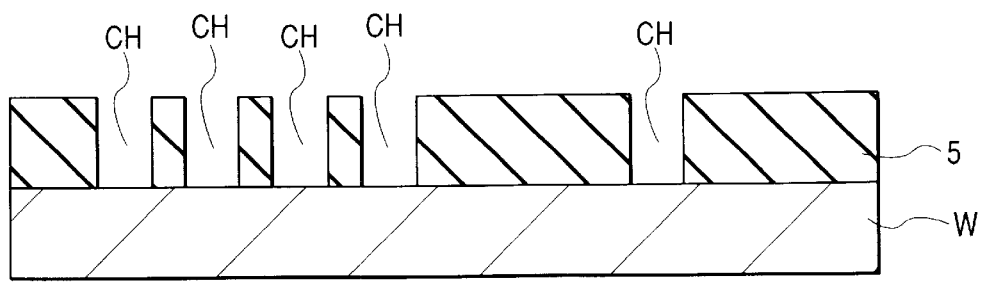
FIG. 8(b) is a cross-sectional view taken along the line A3—A3 of FIG. 8(a).

Thereafter, etching is conducted on the wafer W, using the photoresist pattern 6A as an etching mask. Thereby, as illustrated in FIGS. 7(a) and 7(b), the interlayer insulation film 5 exposed from the photoresist pattern 6A is removed and contact holes CH extend to the interlayer insulation films 5 in both of the fine and coarse regions. Thereafter, the photoresist pattern 6A is removed as illustrated in FIGS. 8(a)

and 8(b). The main plane of the wafer W, or a part of the upper surface of a gate electrode formed on the main plane of wafer W, is exposed from the bottom part of the contact hole CH. The shape of the contact hole CH is, for example, almost circular. The wafer W is finally divided, for example, into semiconductor chips having a flat square shape.

Figure 9A:
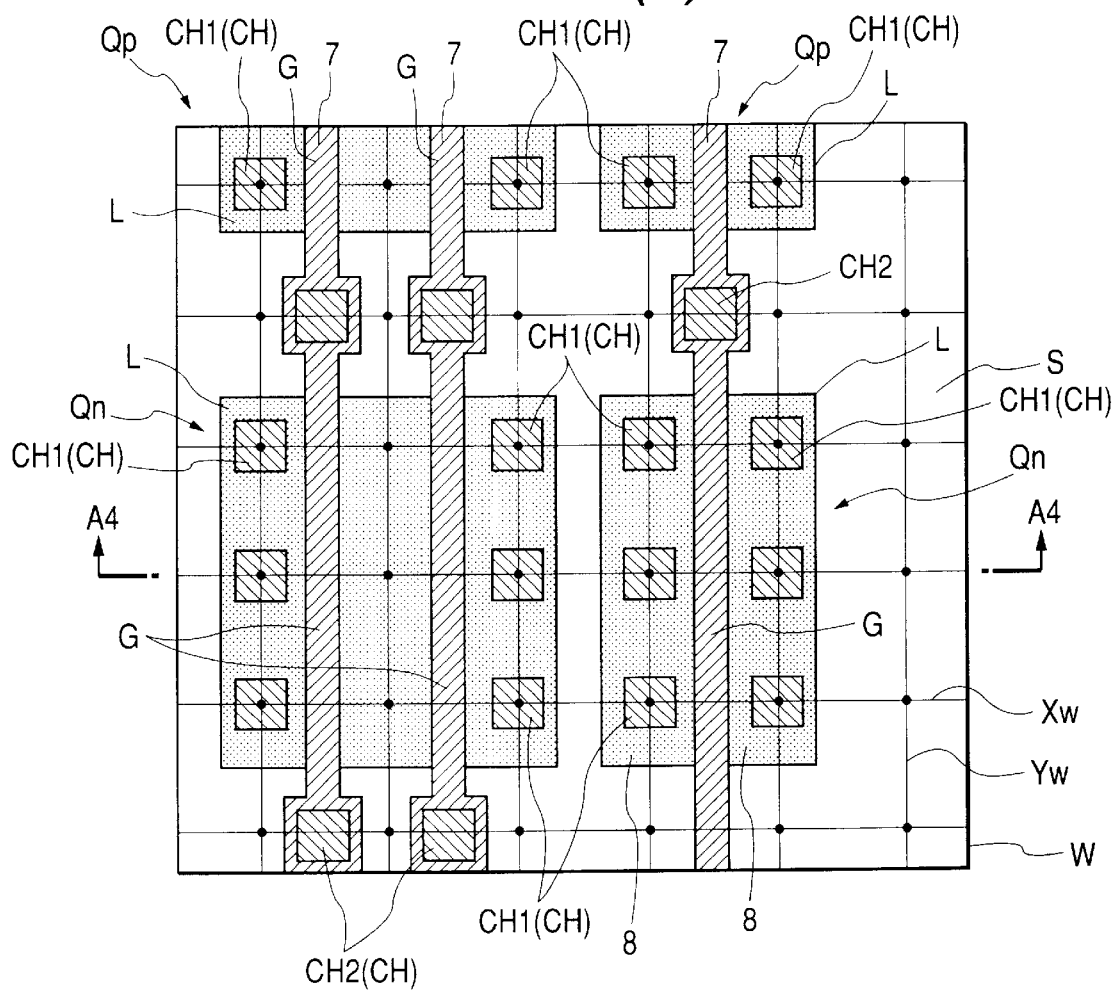
FIG. 9(a) is a plan view of a portion of the fine region of the semiconductor IC device including CMIS-logic, representing an embodiment of the present invention.
Figure 9B:
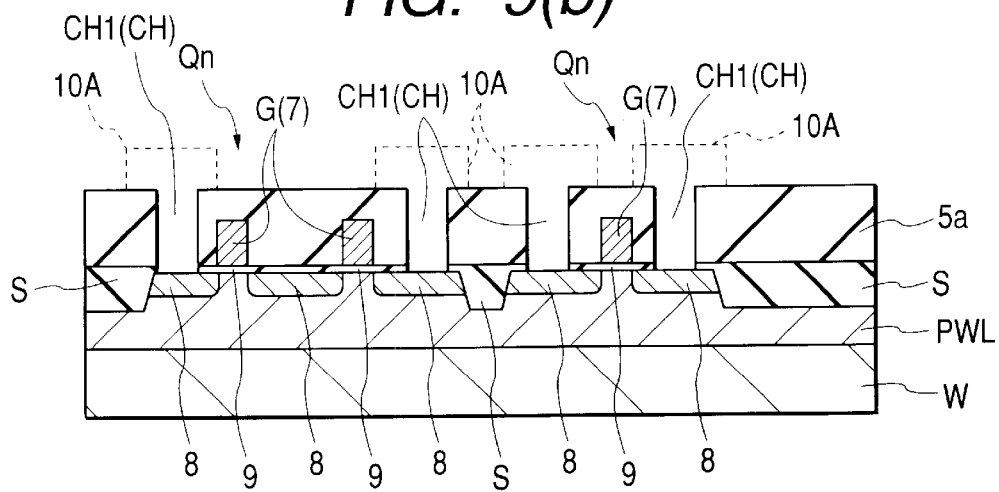
FIG. 9(b) is a cross-sectional view taken along the line A4—A4 of FIG. 9(a).

FIGS. 9(a) and 9(b) illustrate a practical examples of the fine region in a semiconductor IC device including a CMIS-logic circuit. FIG. 9(a) is a plan view of a portion of the semiconductor IC device, while FIG. 9(b) is a cross-sectional view taken along the line A4—A4 of FIG. 9(a).

At the predetermined depth from the main plane of wafer W, the p-well PWL and n-well are formed. Moreover, at the main plane of wafer W, a plurality of active regions L and an isolating region S surrounding these active regions are formed. In the active regions L, nMISQn and pMISQn are formed. In addition, the isolating region S is formed, for example, in the shape of a groove (trench isolation). However, the isolating region S is not limited to the shape of a groove and may be formed, for example, with a field insulation film using the LOCOS (Local Oxidation of Silicon) method.

On the main plane of the wafer W, a plurality of wirings 7 extending in the upper and lower directions of FIG. 9(a) are allocated in parallel. The wirings 7 are formed, for example, of a discrete film of low resistance polysilicon, a polycide film where a silicide film such as a cobalt silicide or the like is deposited on a low resistance polysilicon, or of a polymetal film where a metal film such as tungsten or the like is deposited on a low resistance polysilicon via a barrier film such as tungsten nitride or the like. The pitch of the adjacent wirings 7 is, for example, about 0.32 μm. In this wiring 7, the portions overlapping in the plane on the active region L are the gate electrodes G of the nMISQn and pMISQp. The gate width is, for example, about 0.1 μm. Moreover, in the wiring 7, a region which is wider than the other portion is formed as a portion overlapping in the plane on the isolating region S. Meanwhile, in the active region L, the portions overlapping in the plane on the wiring 7 are channel regions of the nMISQn and pMISp. Moreover, in the active region L, both sides of gate electrode G form a pair of semiconductor regions 8 for source and drain. In the semiconductor region 8 of the nMISQn, phosphorus or arsenic, for example, is doped, and boron, for example, is doped to the semiconductor region 8 of the pMISQp. Moreover, a gate insulation film 9 is provided between the lower surface of the gate electrode G and the main plane of wafer W. The gate insulation film 9 is formed, for example, of a silicon oxide film, a laminated film of silicon nitride and silicon oxide, or of a high dielectric material film or the like.

On this main plane of the wafer W, an interlayer insulation film 5a formed, for example, of silicon oxide is deposited. On this interlayer insulation film 5a, a plurality of contact holes CH (CH1, CH2) are allocated. The upper surface of the semiconductor region 8 is exposed from the bottom surface of the contact hole CH1. This control hole CH1 is allocated in such a manner that the center thereof is over-lapped on the intersecting points of the virtual lines Xw, Yw. On the other hand, the upper surface of the wider region of wiring 7 is exposed from the bottom surface of the contact hole CH2. This control hole CH2 is not allocated at the intersecting points of the virtual lines Xw and Yw, but is disposed at a position deviated by a half-pitch in the lateral direction (extending direction of the virtual line Xw) in FIG. 9(a) from such intersecting points, namely at the intermediate position between adjacent intersecting points in the lateral direction of FIG. 9(a). A broken line in FIG. 9(b) indicates the first layer wiring 10A. The first layer wiring 10A is composed, for example, of aluminum, aluminum alloy or of a metal film of tungsten or copper or the like, and is electrically connected with the semiconductor region 8 or wiring 7 via the contact holes CH (CH1, CH2).

Figure 10A:
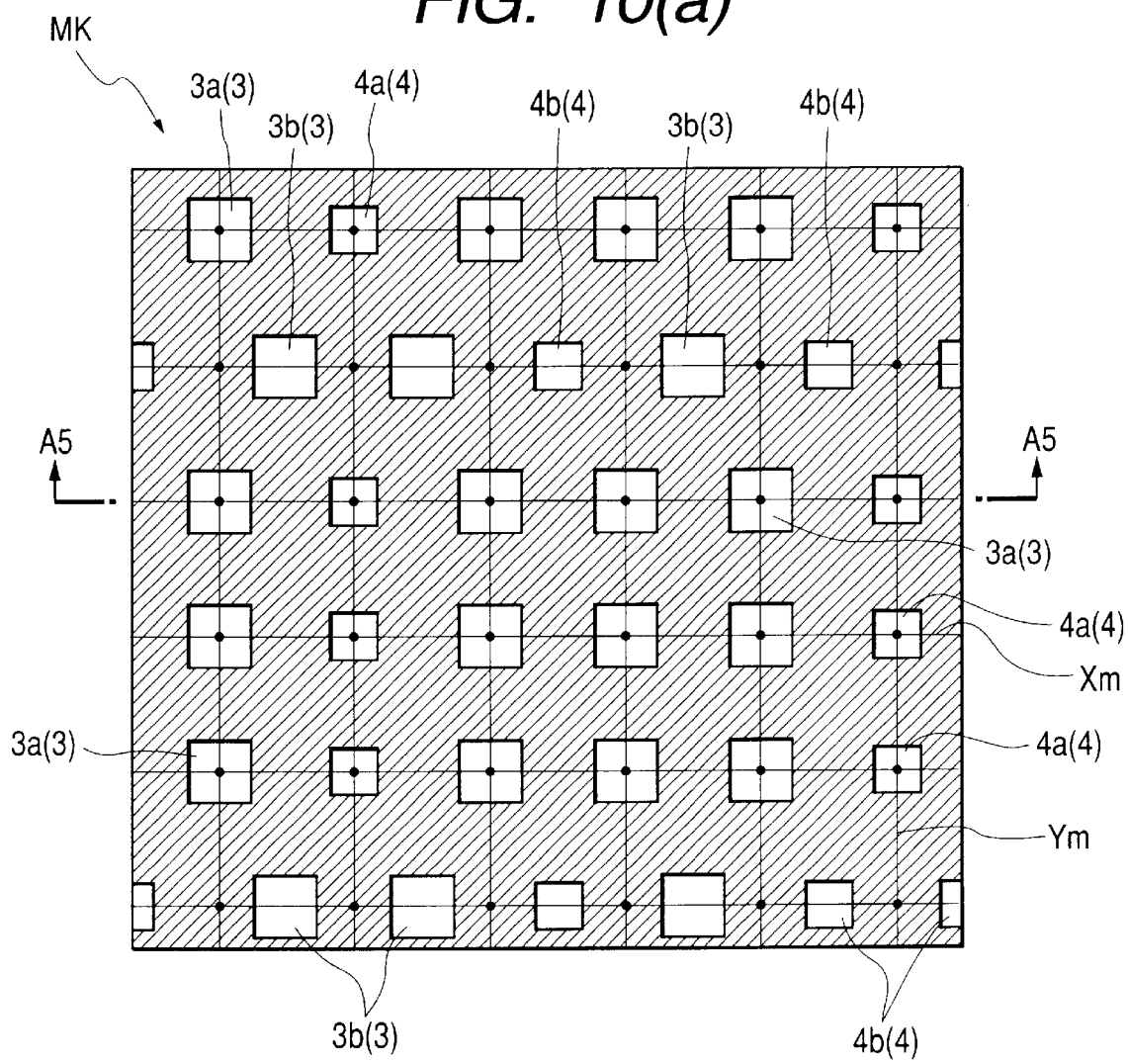
FIG. 10(a) is a plan view of s portion of a pattern transfer mask of the semiconductor IC device of FIG. 9(a).
Figure 10B:
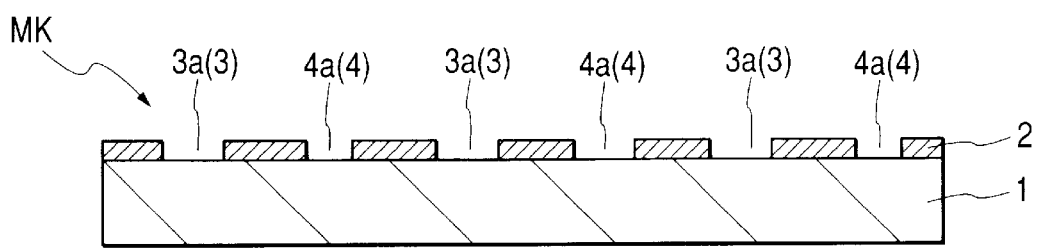
FIG. 10(b) is a cross-sectional view taken along the line A5—A5 of FIG. 10(a).

FIGS. 10(a) and 10(b) illustrate an example of the mask MK used to transfer the contact hole CH of FIG. 9(a). FIG. 10(a) is a plan view of a portion of the mask MK, while FIG. 10(b) is a cross-sectional view taken along the line A5—A5 of FIG. 10(a).

The main apertures (first main aperture) 3a(3) form an aperture pattern to transfer the contact hole CH1 and are allocated on the mask MK in a manner such that the center thereof is disposed on an intersecting point of the virtual lines Xm, Ym. Moreover, the main apertures (second main aperture) 3b (3) form an aperture pattern to transfer the contact hole CH2. This main aperture 3b is not allocated at an intersecting point of the virtual lines Xm, Ym, but is disposed at a position deviated by a half-pitch in the lateral direction (extending direction of the virtual line Xm) of FIG. 10(a), namely at the intermediate position between the adjacent intersecting points in the lateral direction of FIG. 10(a). The sizes of the main apertures 3a, 3b are equal with each other and are identical to the size of the main aperture 3.

On the other hand, the auxiliary apertures (first auxiliary aperture) 4a (4) are allocated on the mask MK in a manner such that the center thereof overlaps on intersecting points of the virtual lines Xm, Ym. Moreover, the auxiliary apertures (second auxiliary aperture) 4b (4) are not allocated at intersecting points of the virtual lines Xm, Ym, but are disposed at a position deviated by half-pitch in the lateral direction (extending direction of the virtual line Xm) of FIG. 10(a) from such intersecting points, namely at an intermediate position between adjacent intersecting points in the lateral direction of FIG. 10(a). The sizes of auxiliary apertures 4a, 4b are equal with each other and are identical to the size of the auxiliary aperture 4.

As a modification, for example, the main aperture 3b and auxiliary aperture 4b can be allocated at a position deviated by a half-pitch in the extending direction of the virtual line Ym, namely at the intermediate position between the adjacent intersecting points in the vertical direction of FIG. 10(a).

Figure 11:
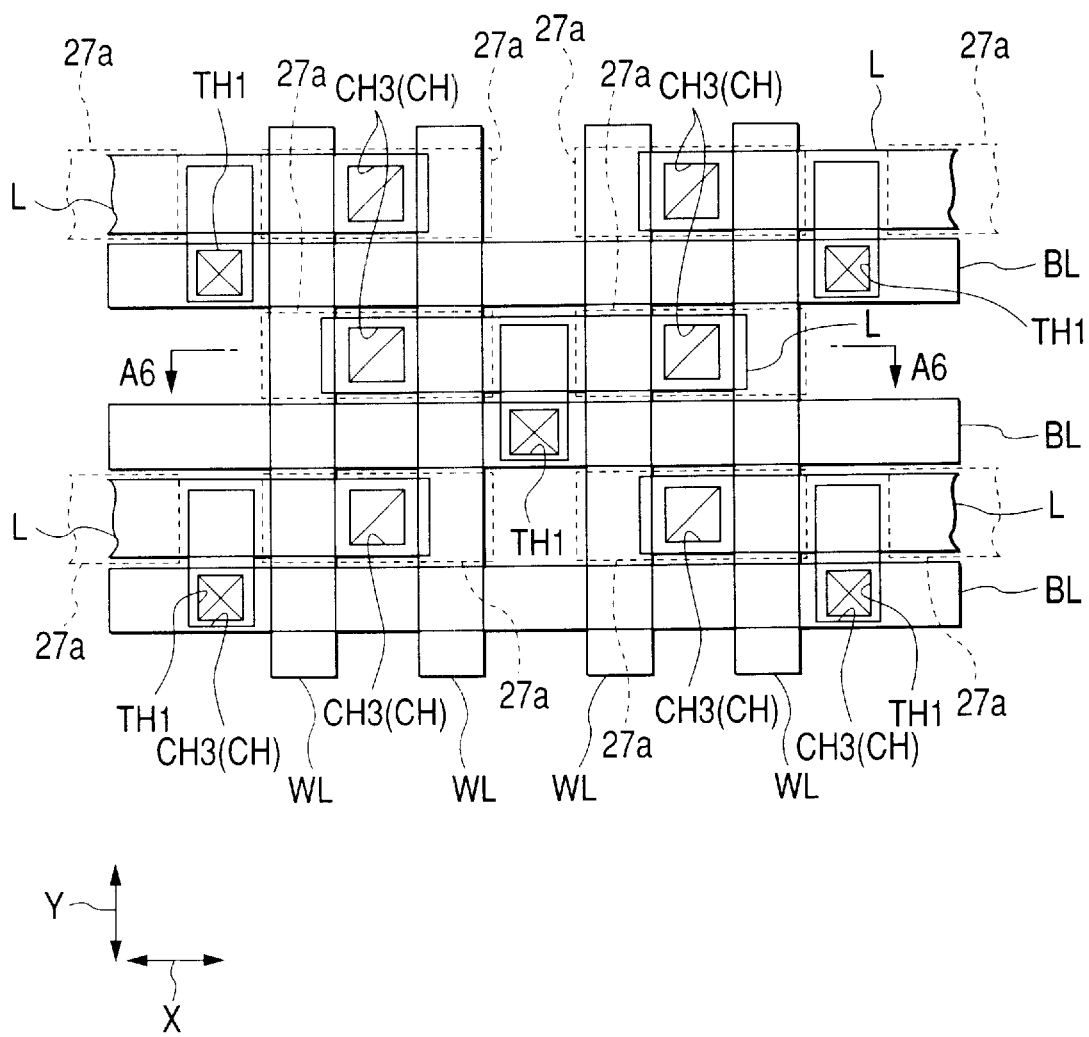
FIG. 11 is a plan view of a portion of the fine region of the semiconductor IC device, including a DRAM-logic hybrid circuit, representing an embodiment of the present invention.
Figure 12:
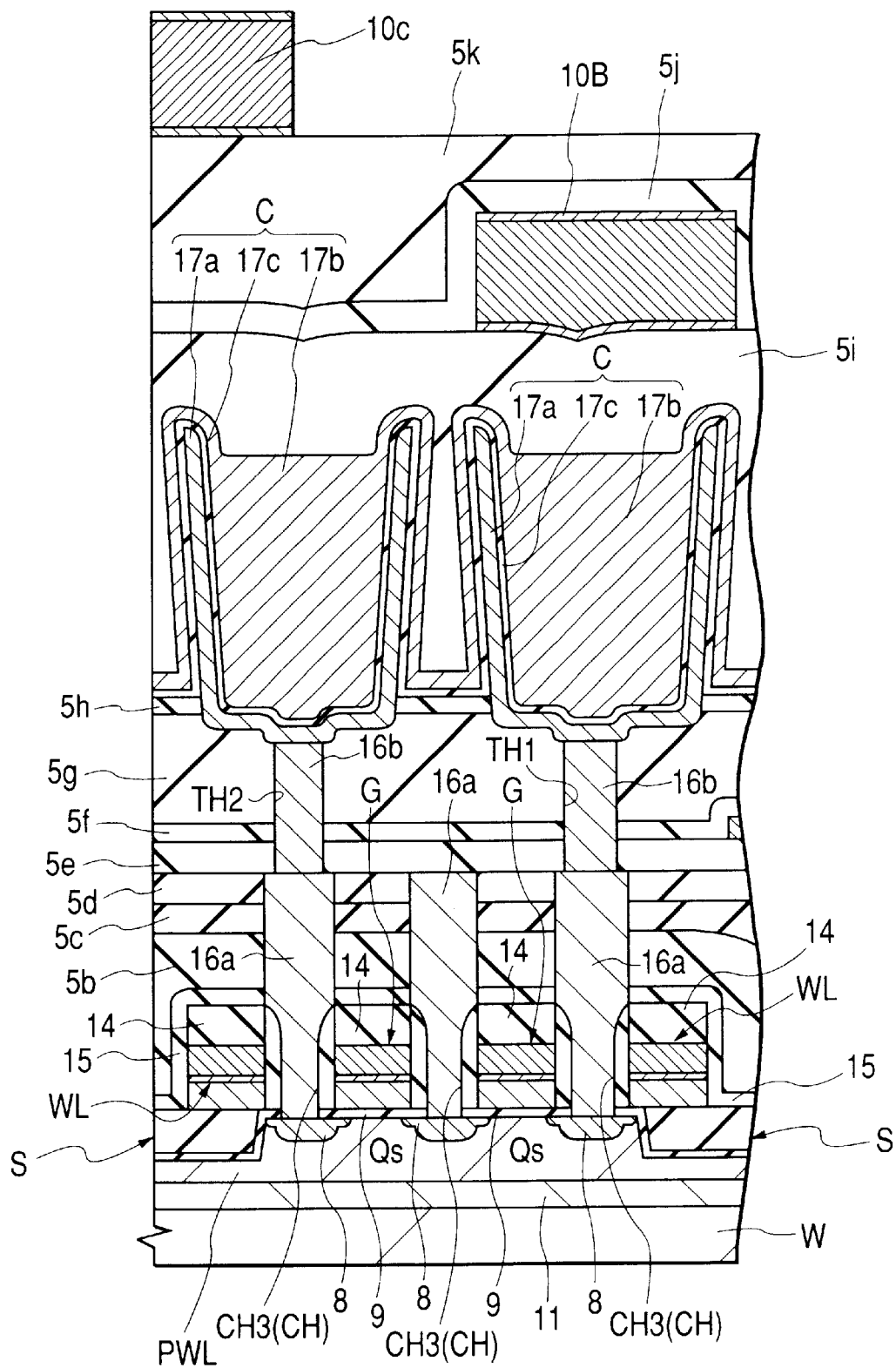
FIG. 12 is a cross-sectional view taken along the line A6—A6 of FIG. 11.

FIG. 11 and FIG. 12 illustrate a practical example of the fine region of a semiconductor IC device including a DRAM-logic hybrid circuit. FIG. 11 is a plan view of a portion of the relevant semiconductor IC device, and FIG. 12 is a cross-sectional view taken along the line 6A—6A of FIG. 11.

The wafer W is formed, for example, of p-type silicon single crystal. A memory cell of the DRAM is formed in the p-well PWL formed on the wafer W. The p-well PWL of the region (memory array) where a memory cell is formed is electrically isolated from the semiconductor substrate with an n-type semiconductor region 11 formed thereunder in order to prevent entry of noise from an input/output circuit formed in the other region of the semiconductor substrate forming the wafer W.

The memory cell is formed to have a stacked structure in which an information accumulation capacitance element C is allocated at the upper part of the MISFETQs for memory cell selection. The MISFETQs for memory cell selection is formed of a nMIS and is formed within the active region L of the p-well PWL. The active region L is formed to have a pattern like a narrow island extending in a straight line along the X direction (corresponding to the extending direction of the virtual line Xw) of FIG. 11, and a couple of MISFETQs for memory cell selection are formed adjacently with any one of the source and drain (semiconductor region 8) used in common in the X direction of the respective active region L.

The isolating region S surrounding the active region L is structured with a groove type element isolating portion (trench isolation) that is formed by embedding the insulation film, consisting of a silicon oxide film, in the shallow groove opened to the p-well PWL. The insulation film embedded in this groove type element isolating region S is flattened at the surface. Since such groove type element isolating region S does not form a bird's beak at the end portion of the active region L, it is possible to obtain a larger effective area of the active region L in comparison with the isolating region (field oxide film) of the same size formed with the LOCOS process (Local Oxidization of Silicon: selective oxidization).

The MISFETQs for memory cell section is mainly formed of a gate insulation film 9, a gate electrode G and a pair of n-type semiconductor regions 8 forming the source and drain. The gate electrode G is integrally formed with the word line WL and extends linearly along the Y direction (corresponding to the extending direction of the virtual line Yw) in the same width and the same space. The gate electrode G (word line WL) is formed, for example, in the polymetal structure explained above. Since the gate electrode G (word line WL) of the polymetal structure has an electric resistance that is lower than that of the gate electrode structured with the polycrystalline silicon film and polycide film, signal delay of the word line can be reduced. However, the gate electrode G may be structured with a discrete film of the polycrystalline silicon film or may be formed in the polycide structure.

At the upper part of the gate electrode G (word line WL) of the MISFETQs for memory cell selection, a cap insulation film 14, consisting of a silicon nitride film or the like, is formed, and an insulation film 15, consisting, for example, of the silicon nitride film, is formed at the upper part and side wall of the cap insulation film 14 and the side wall of the gate electrode G (word line WL). The cap film 14 and insulation film 15 of the memory array are used as an etching stopper on the occasion of forming the contact hole CH3 (CH) on the self-alignment basis for the gate electrode G at the upper part of the source and drain (n-type semiconductor regions 8, 8) of the MISFETQs for memory cell selection.

On the MISFETQs for memory cell selection, an interlayer insulation film 5b is formed. Moreover, on the interlayer insulation film 5b, the interlayer insulation films 5c, 5d, consisting of double-layer silicon oxide or the like, are formed, and the surface of the upper insulation film 5d is flattened. At the upper part of a pair of n-type semiconductor regions 8, 9 forming the source and drain of the MISFETQs for memory cell selection, a contact hole CH3 (CH) is formed through the interlayer insulation films 5d, 5c, 5b. The plain allocation of the contact hole CH3 conforms to the allocation conditions explained above. Moreover, the structure of the mask used to form the contact hole CH3 is also identical to that explained above. In addition, a method to form the contact hole CH3 is also identical to that for the contact hole CH, and, therefore, an explanation thereof is omitted here. At the inside of such contact hole CH3, for example, a plug 16a that is formed of a phosphorus(P)-doped polycrystalline silicon film of low resistance is embedded. The size in the X direction of the bottom portion of the contact hole CH3 is specified with the space of the insulation film 15 at one side wall and the insulation film 15 of the other side wall of the two gate electrodes G (word line WL) provided opposite to each other. Namely, the contact hole CH3 is formed on a self-alignment basis for the gate electrode G (word line WL).

The size of one contact hole CH3 in the Y direction (vertical direction in FIG. 11) among the contact holes CH3, CH3 is almost identical to the size in the Y direction of the active region L. On the other hand, the diameter in the Y direction of the other contact hole CH3 (contact hole on the. n-type semiconductor region 8 used in common with the two MISFETQs for memory cell selection) is larger than the size of the active region L in the Y direction. Namely, the contact hole CH3 is structured with an almost rectangular plane pattern in which the diameter in the Y direction is larger than the diameter in the X direction (lateral direction in FIG. 11), and a part of this contact hole CH3 is deviated from the active region L and extends on the groove type isolating region S. Since the contact hole CH3 is formed with such a pattern, it is no longer necessary to extend the bit line BL up to the upper part of the active region L by partly increasing the width of this bit line and to extend a part of the active region L in the direction of the bit line BL. Thereby, the memory size can be reduced.

An insulation film 5e is deposited on the insulation film 5d. On the insulation film 5e on the contact hole CH3, a through-hole TH1 is formed, and a plug that is formed of a conductive film, by sequentially laminating a Ti (titanium) film, a TiN (titanium nitride) film and a W (tungsten) film from the lower side, is embedded in this through-hole TH1. The through-hole TH1 is allocated at the upper part of the groove type isolating region S that is deviated from the active region L. The allocation of this through-hole TH1 conforms to the allocation condition of the contact hole CH. Moreover, the structure of the mask used to form the through-hole TH1 is also identical to that of the mask used to form the contact hole CH. Moreover, the method of forming the through-hole TH1 is also identical to that of forming the contact hole CH, and so an explanation thereof is omitted here.

On the interlayer insulation film 5e, a bit line BL is formed. The bit line BL is allocated at the upper part of the groove type element isolating region S and linearly extends along the X direction in the same width and same space. The bit line BL is formed, for example, of a tungsten film and is electrically connected with one (n-type semiconductor region 8 used in common with the two MISFETQs for memory cell selection) of the source and drain of the MISFETQs for memory cell selection through the contact hole CH3 formed at the through-hole TH1, interlayer insulation films 5e, 5d, 5c, 5b at the lower part of the through-hole and the gate insulation film 9.

On the bit line BL, the interlayer insulation films 5f, 5g, consisting, for example, of silicon oxide, are formed.

The surface of the upper interlayer insulation film 5g is flattened. On the interlayer insulation film 5g of the memory cell array, an interlayer insulation film 5h, consisting of silicon nitride or the like, is formed, and, moreover, a capacitance element C for information accumulation is formed thereon. The capacitance element C for information accumulation is structured with a lower electrode (accumulation electrode) 17a, an upper electrode (plate electrode) 17b and a capacitance insulation film (dielectric material film) 17c consisting of $Ta_2O_5$ (tantalum oxide) provided between such upper and lower electrodes. The lower electrode 17a is formed, for example, of a phosphorus (P)-doped low resistance polycrystalline silicon film, and the upper electrode 17b is formed, for example, of a TiN film. The lower electrode 17a of the element capacitance C for information accumulation is electrically connected with a plug 16a in the contact hole CH3 via the plug 16b embedded in the through-hole TH2 provided through the insulation film 5h and the insulation films 5g, 5f, 5e at the lower layer of this insulation film, and, moreover, it is also connected electrically to the other of the source and drain (semiconductor region 8) of the MISFETQs for memory cell selection via the plug 16a.

At the upper part of the capacitance element for information accumulation, an interlayer insulation film 5i, consisting of double-layer silicon oxide or the like is formed, and, moreover, the second layer wiring 10B is formed thereon. On this second layer wiring 10B, the interlayer insulation films 5j, 5k, consisting of the double-layer silicon oxide or the like, are also formed. On the interlayer insulation film 5k, the third layer wiring 10C is formed. The second and the third layer wirings 10B, 10C are structured, for example, of a conductive film mainly composed, for example, of aluminum (Al) alloy.

Next, an example of the aligner used in this embodiment will be explained with reference to FIG. 13 and FIGS. 14(a) and 14(b).

For example, the aligning conditions of the aligner 20 are as follows. Namely, as the light beam for alignment of the aligner 20a, for example, a KrF excimer laser beam (alignment wavelength $\lambda=248$ nm) is used. However, the aligning laser beam is not limited to that specified above, and various other laser beams can be used. For example, it is also possible to use a ArF excimer laser at the wavelength of 193 nm and a $F_2$ laser at the wavelength of 157 nm. The numerical aperture NA of an optical lens is set, for example, to 0.6. As the aligning method, for example, the scanning alignment, step and scan alignment or step and repeat alignment may be used.

The laser beam emitted from the aligning source 20a radiates a mask MK via a fly-eye lens 20b, an aperture 20c, condenser lenses 20d1, 20d2 and a mirror 20e. Among the optical conditions, the shape of the opening of aperture 20c is adjusted depending on the shape of the modified lighting, as exemplified in FIGS. 14(a) and 14(b). Since the depth of focus and the alignment allowance can be improved both in the coarse region and fine region by utilizing a mask having the structure described above, the resolution can also be improved. Moreover, the pattern size difference resulting from size variation for deviation of focus and the coarse or fine condition of patterns can also be reduced. Moreover, it is also possible that the auxiliary aperture on the mask is not resolved on the wafer for a predetermined exposure.

Figure 14A:
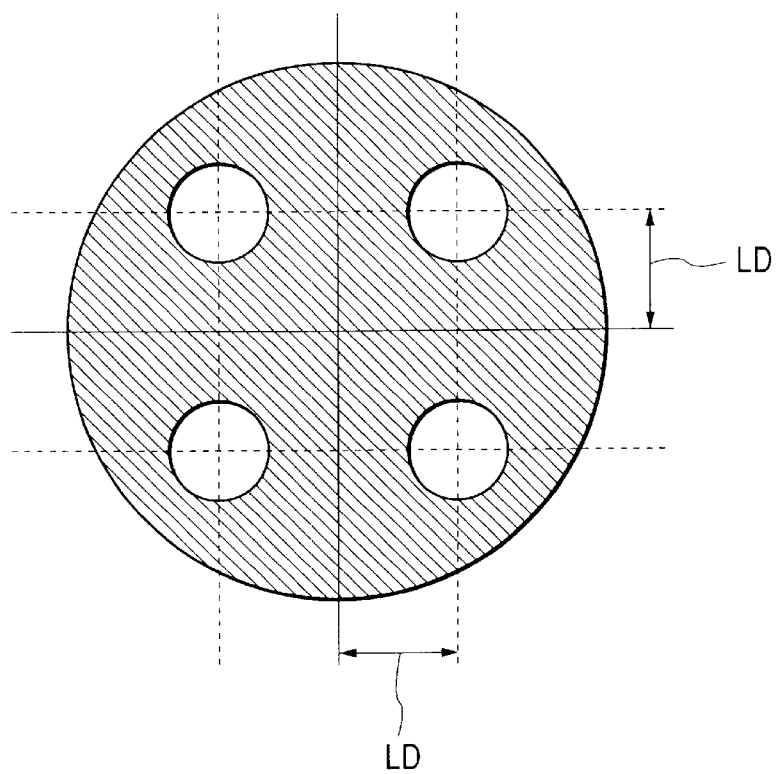
FIG. 14(a) is a plan view of 4-aperture lighting as an example of the lighting system of the aligner of FIG. 13.
Figure 14B:
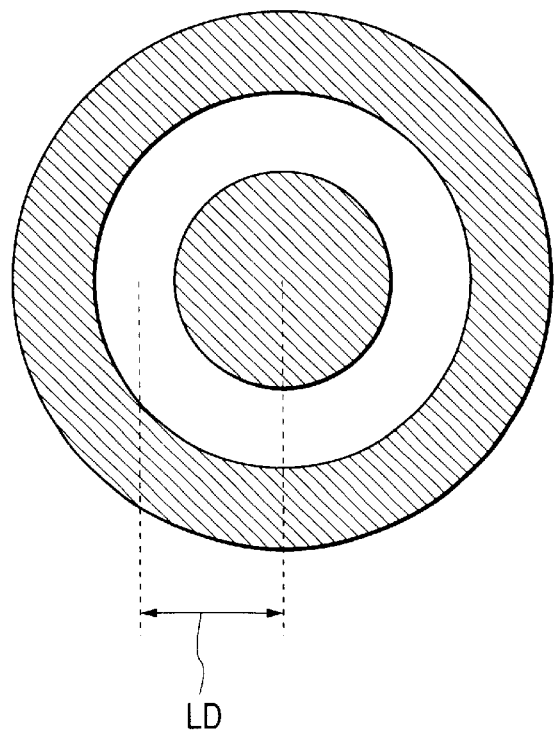
FIG. 14(b) is a plan view of ring belt lighting as another example of the lighting system of the aligner of FIG. 13.

FIG. 14(a) illustrates 4-aperture lighting, while FIG. 14(b) illustrates ring-belt lighting. In the 4-aperture lighting and ring-belt lighting, the distance LD of the center of the aperture from the optical axis is set, for example, to about 0.65. The radius of the aperture in the 4-aperture lighting is set, for example, to about 0.2. The optimum value of the distance LD is LD=$(1/(2D))\lambda$/NA. D is the pitch Dwx, Dwy of the virtual line Xw, Yw. For example, when the above values are inserted in the above formula, LD=($\frac{1}{2}\times 0.32$) 0.248/0.6=0.645. Therefore, it is approximated to about 0.65. Here, Dwx=Dwy. In the case of 4-aperture lighting, since the aperture is optimized to the period pattern pitch in the vertical and lateral directions required, a good aligning condition may be attained. Moreover, in the case of ring-belt lighting, the aperture is optimized to the period pattern pitch in the vertical and lateral directions required, and, moreover, the aperture corresponds to the pattern pitch in the other oblique direction, resulting in flexibility from the practical viewpoint.

Figure 13:
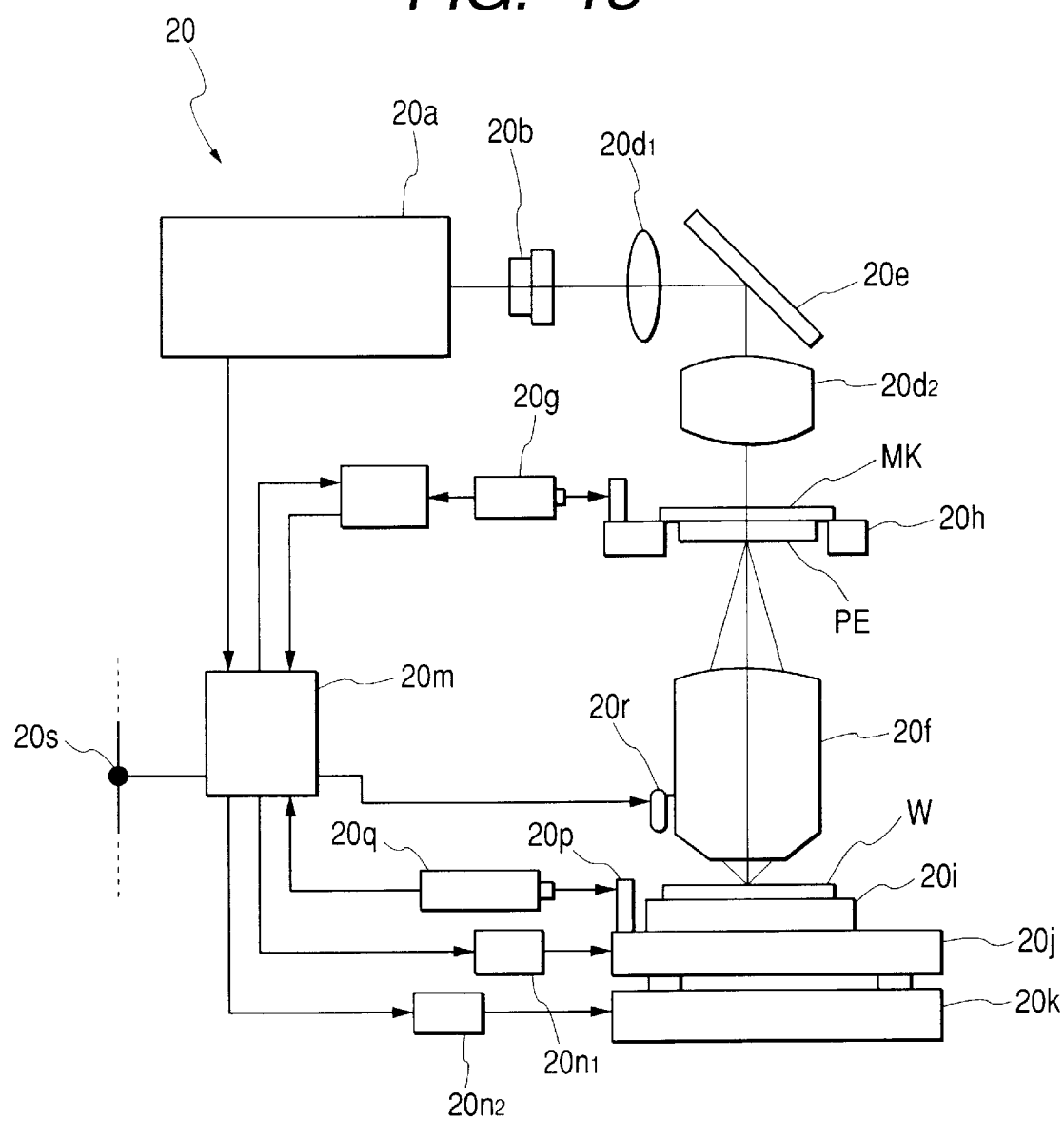
FIG. 13 is schematic block diagram showing an example of an aligner used for the manufacture of a semiconductor IC device, representing an embodiment of the present invention.

On the mask MK of FIG. 13, a pellicle PE is provided to prevent generation of a pattern transfer fault or the like due to adhesion of foreign material. A mask pattern depicted on the mask 26 is projected on the wafer W serving as the sample substrate via a projection lens 20f. Here, the mask MK is placed on a mask stage 20h, the position of which is controlled using a mask position control means 20g, and the center thereof and the optical axis of the projection lens 20f placed are in an accurate positioning condition. The wafer W is vacuum-attracted on the wafer stage 20i. The wafer stage 20i is placed on a Z stage 20j, which may be movable in the optical axis direction of the projection lens 20f, namely, in the Z direction, and, moreover, it is placed on the XY stage 20k. Since the Z stage 20j and XY stage 20k are driven with respective drive means 20n1, 20n2 depending on the control instruction from a main control system 20m, these can be moved to the desired aligning position. Such aligning position is accurately monitored with a laser measuring device 20q using the position of a mirror 20p fixed to the Z stage 20j. Moreover, the surface position of the wafer W (substrate 1) is measured with a focal position detecting means provided in an ordinary aligner. The surface of wafer W can always be matched with the focusing plane of the projection lens 20f by driving the Z stage 20j depending on the result of measurement.

On the occasion of overlay alignment of the circuit pattern on the mask MK for the circuit pattern formed on the wafer W the position of a mark pattern formed on the wafer W is detected with an alignment detection optical system 20r, and the overlay transfer is performed after the positioning of the wafer W based on the result of detection. The main control system 20m is electrically connected with a network apparatus 20s to enable remote monitoring of the conditions of the aligner 20.

Figure 15:
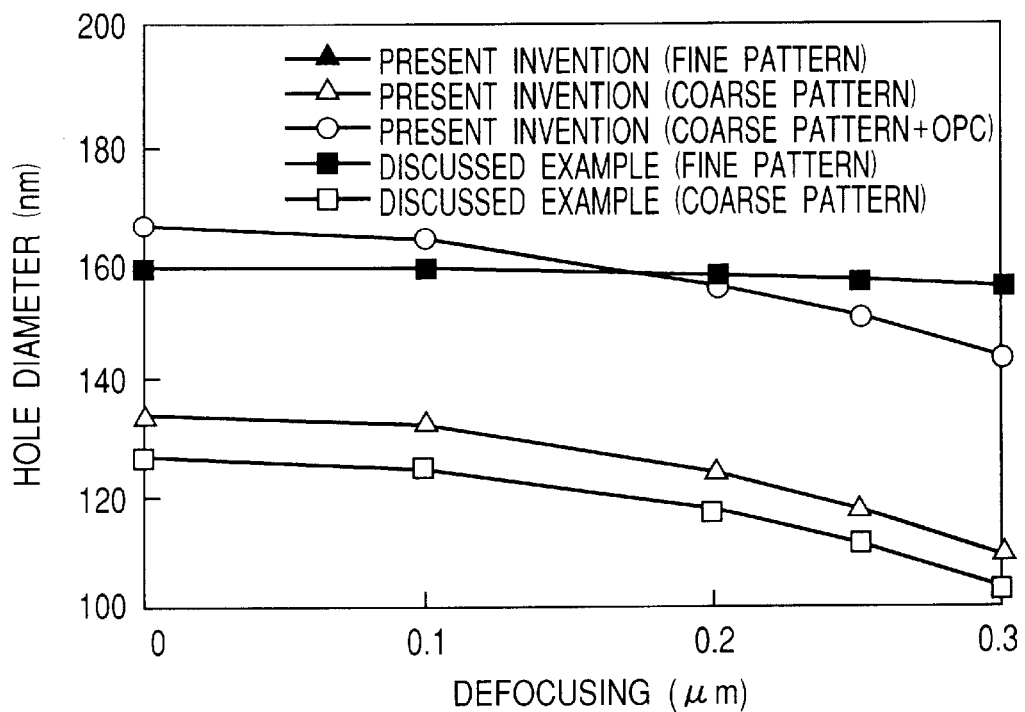
FIG. 15 is a graph indicating dependence on deviation of focal point of the hole diameter in the present invention and a comparative example.

FIG. 15 illustrates a result of comparison of the focus depth characteristic (dependence on deviation of focus of the hole diameter) based on the simulation in such cases where the mask of the present invention (half-tone mask) is used and the mask discussed with the inventors of the present invention (for example, the technique represented by Japanese Unexamined Patent Publication No. 135402/1999: binary mask) is used. The optical proximity effect (OPC) will be explained with regard to the other embodiments to be explained later.

The aligning intensity of simulation has been determined to provide a diameter of the transfer pattern (hole pattern) of the fine pattern of about 0.16 $\mu$m when the focus deviation is zero (0). In regard to the fine pattern, it is overlapped when the mask of the present invention is used (black triangle) and when the mask discussed by the inventors of the present invention is used (black square), and so there is no preference between such masks. On the other hand, in regard to the coarse pattern, when the mask of the present invention is used (white triangle) is used, the pattern size difference is more improved by about 7 nm than that when the mask discussed by the inventors of the present invention (white square) is used.

Figure 16:
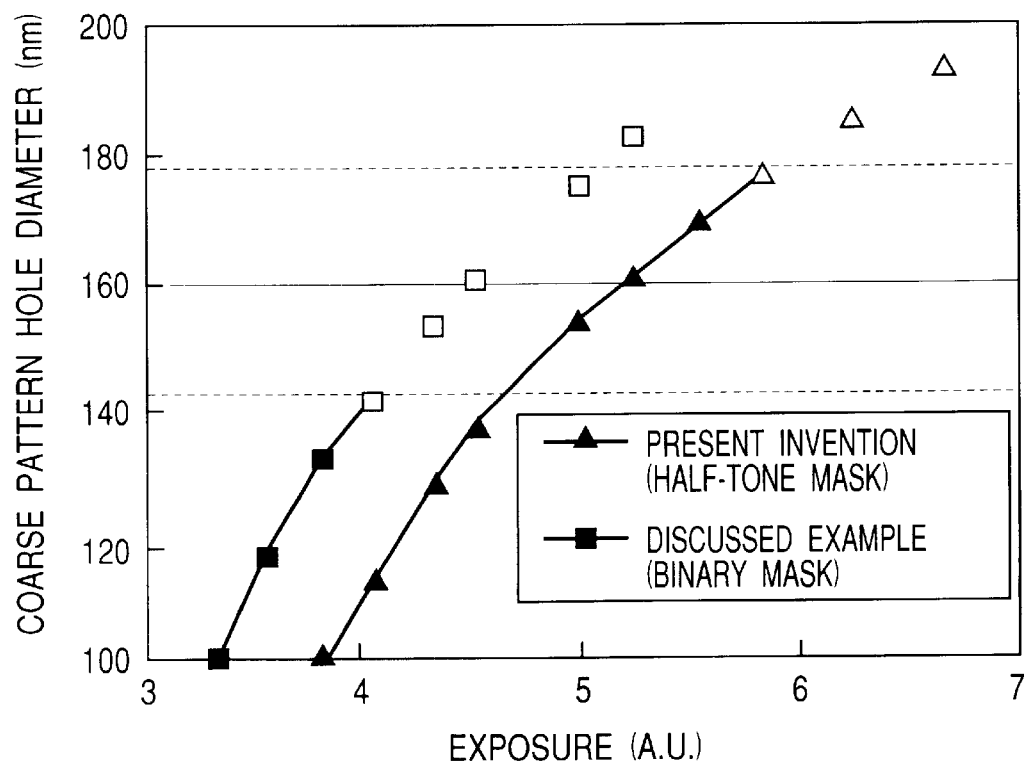
FIG. 16 is a graph indicating dependence on exposure of hole pattern diameter in the coarse region in the present invention and a comparative example.

FIG. 16 illustrates a result of simulation of the hole pattern diameter in the coarse region for the exposure. The white triangle and square plots indicate that the auxiliary aperture on the mask is resolved. Determination for resolution or not of the auxiliary aperture is made considering the margin to provide a result such that the aligning intensity at the auxiliary aperture becomes 80% or less of the resolved alignment intensity for the non-resolution purpose. In the technique discussed by the inventors of the present invention, application is impossible because the auxiliary aperture of the mask is resolved on the wafer with an exposure in which the hole pattern diameter is about 160 nm that has been desired. On the other hand, in the mask of the present invention, it can be understood that application is possible because the auxiliary aperture of the mask is not resolved.

As explained above, according to the embodiment 1 of the present invention, the following effects can be attained.
(1) The resolution of the pattern can be improved by using a mask having the structure explained above and the modified lighting for the alignment process.
(2) The size difference of the pattern in the coarse and fine regions can be reduced by using a mask having the structure explained above and the modified lighting for the alignment process.
(3) The size accuracy of the pattern can be improved by using a mask having the structure explained above and modified lighting for the alignment process.
(4) The performance and reliability of a semiconductor IC device can be improved based on the above items (1) to (3).

Embodiment 2

In the case of the mask of the present invention having the structure described above, the size difference between the coarse and fine patterns is as large as about 20 nm and the hole pattern H of FIG. 3 cannot be formed in some cases with the size accuracy of ±10%.

Therefore, in this embodiment, a proximity correction is adopted. Here, it is preferable that this proximity correction is conducted on the main aperture, to which the main aperture to transfer the other hole pattern is not allocated, in the periphery among the main aperture on the mask to transfer the hole pattern in the coarse region and the main aperture on the mask to transfer the hole pattern in the fine region, or to both main apertures described above. The other structure is the same as that in the embodiment 1.

Figure 17:
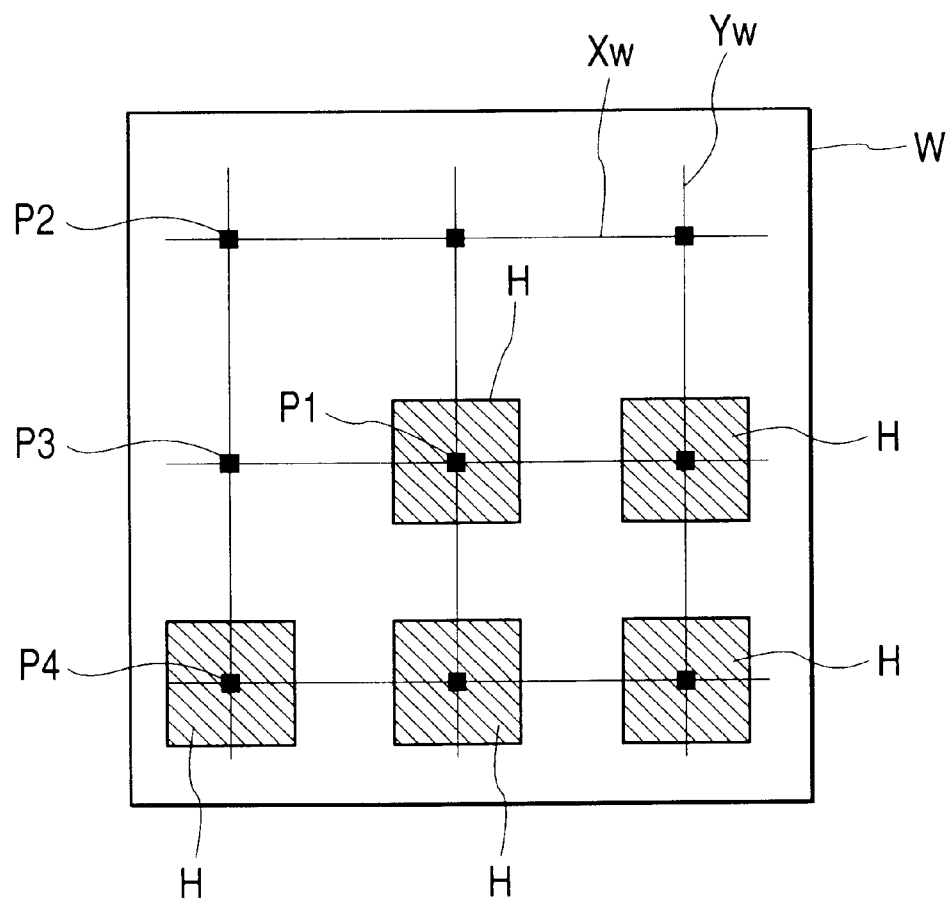
FIG. 17 is a plan view of a portion of a wafer, including hole patterns formed using the photomask according to another embodiment of the present invention.

FIG. 17 illustrates an example as seen in plan view of a portion of the wafer having the hole pattern H formed by using the mask of this embodiment.

Figure 18A:
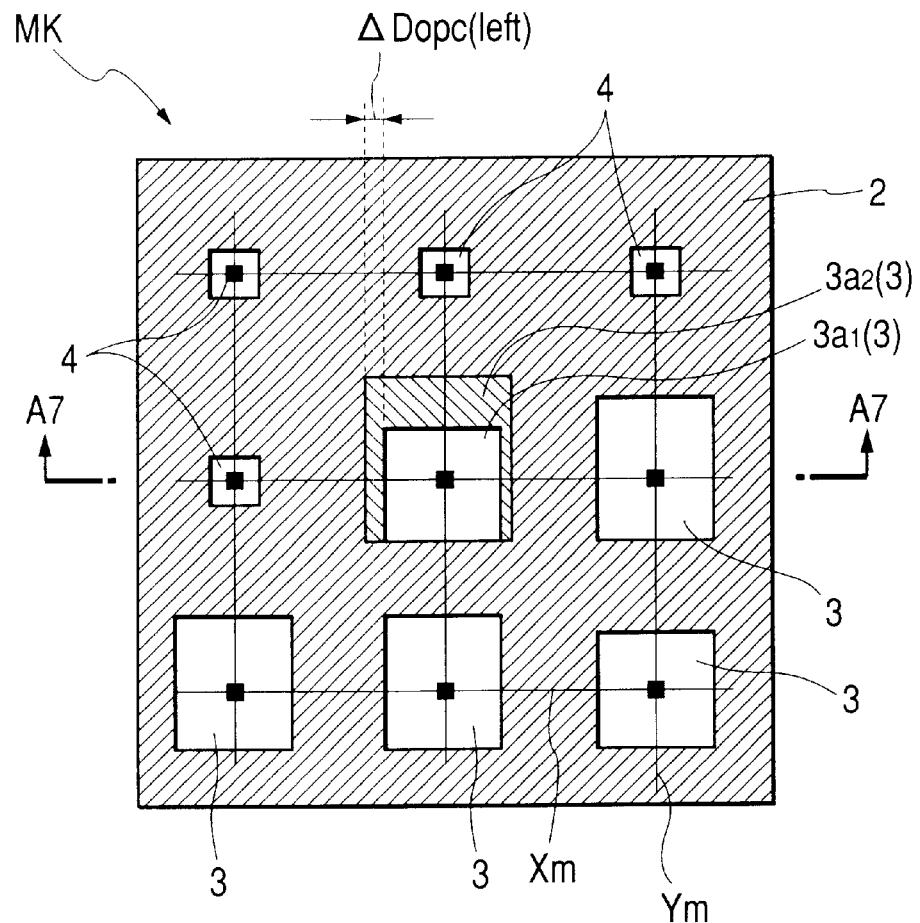
FIG. 18(a) is a plan view of a portion of an example of a photomask used to form a hole patterns of FIG. 17.
Figure 18B:
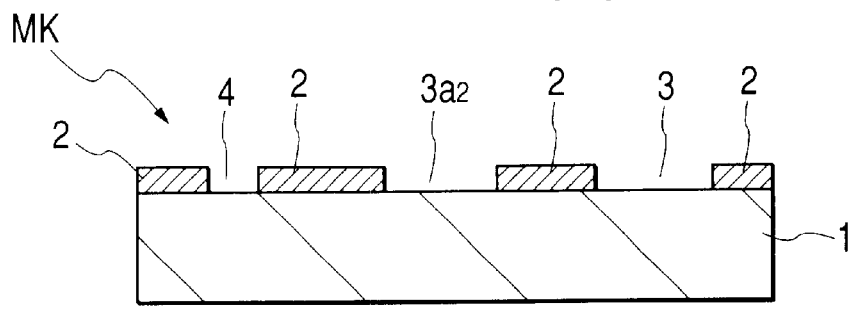
FIG. 18(b) is a cross-sectional view taken along the line A7—A7 of FIG. 18(a).

FIGS. 18(a) and 18(b) illustrate an example of the mask used to form the hole pattern H of this embodiment. FIG. 18(a) is a plan view of a portion of the mask, and FIG. 18(b) is a cross-sectional view taken along the line A7—A7 of FIG. 18(a).

An OPC value Δdopc(Left) of the main aperture 3 at the mask MK to form the hole pattern H allocated at the intersecting point P1 of the virtual lines Xw, Yw on the wafer W can be obtained by accumulating the correction value determined with the relative positions of the respective intersecting points P1, P2, P3, P4 depending on the existence or non-existence of the hole pattern at the intersecting points P2, P3, P4 of the virtual lines Xw, Yw on the wafer. In this example, the hole pattern is not allocated at the intersecting points P2, P3 and the correction values are accumulated respectively. The main aperture 3a1 of the mask MK of FIG. 18(a) indicates the aperture pattern before the proximity correction, while the main aperture 3a2 indicates the aperture pattern after the proximity correction. The size of the main aperture 3a2 after the proximity correction is larger than that of the other main aperture 3.

The effect of adaptation of the proximity correction to the main aperture 3 of the mask MK of FIG. 4 to form the hole pattern H of the coarse region of FIG. 3 has been obtained with the simulation. The plane size converted on the wafer of the auxiliary aperture 4 is, for example, to about 140 nm×150 nm, as explained above, and the proximity correction Δdopc in each direction is set, for example, to about 10 nm, while the plane size converted on the wafer of the main aperture 3 is set, for example, to about 220 nm×220 nm. As a result, as indicated in the focus depth characteristic of FIG. 15, the depth of focus becomes ±0.3 μm when the size accuracy of the pattern is ±10%, and, thereby, the hole pattern H of the coarse region of FIG. 3 can be transferred. Namely, according to this embodiment, the effect that the hole pattern H located at the boundary of the coarse and fine regions can be formed with the size accuracy of ±10% can be obtained in addition to the effects attained in the embodiment 1 explained above.

As a modification, for example, there is provided a structure where the half-tone film 2 of mask MK is replaced with a light shielding film consisting, for example, of a discrete film of chromium or a laminated layer film of chromium and chromium oxide. In this case, the effect explained above can also be attained.

Embodiment 3

In the embodiment 2 explained above, proximity correction is adopted with respect to the main aperture of the mask. In this embodiment, the proximity correction is conducted for the auxiliary aperture of the mask for the same reason as the embodiment 2.

Figure 19:
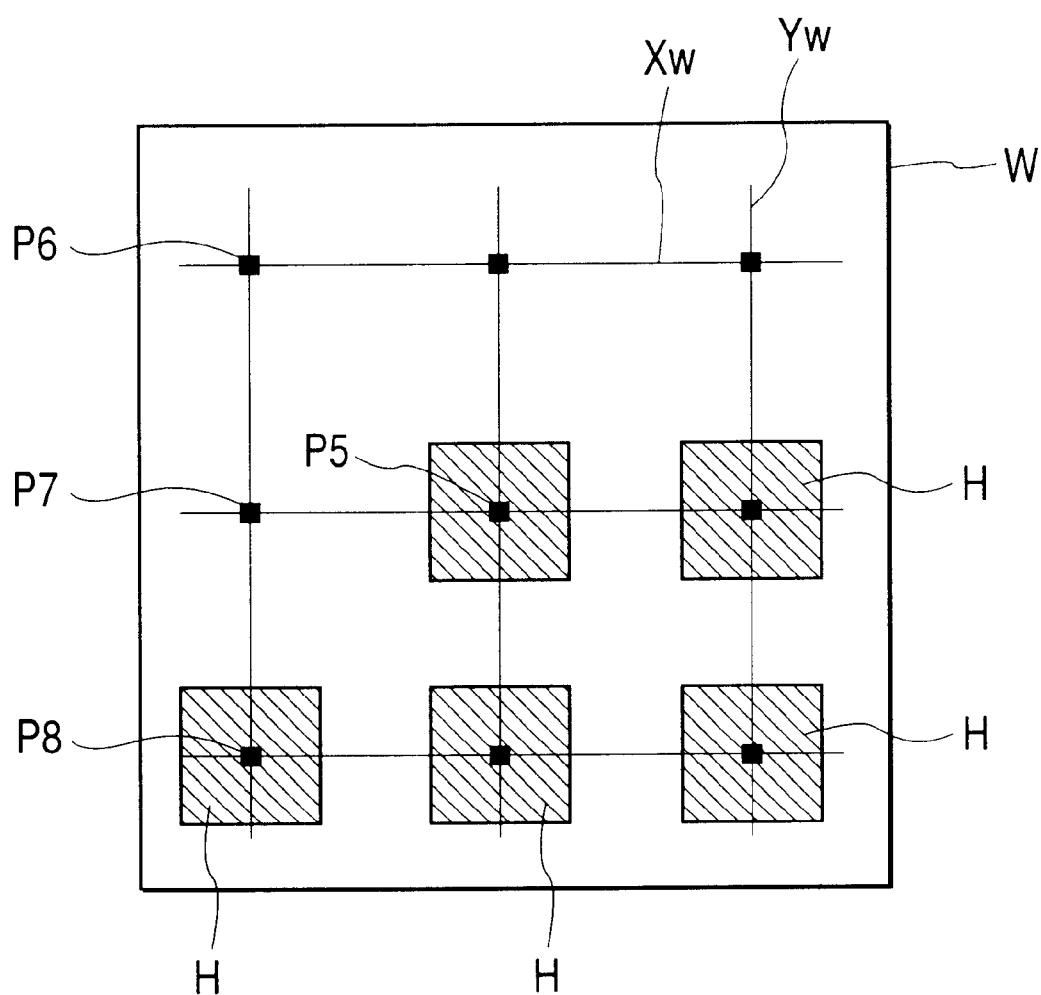
FIG. 19 is a plan view of a portion of the wafer, including the hole patterns formed using the photomask according to another embodiment of the present invention.
Figure 20A:
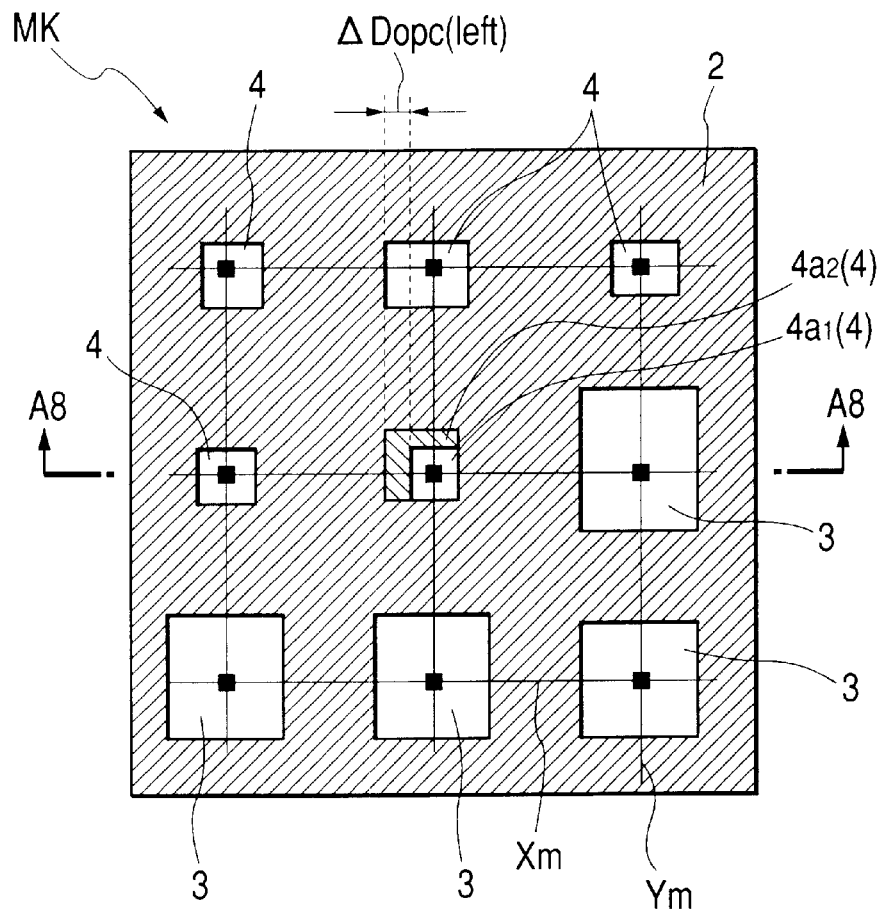
FIG. 20(a) is a plan view of a portion of an example of the photomask used to form the hole patterns of FIG. 19.
Figure 20B:
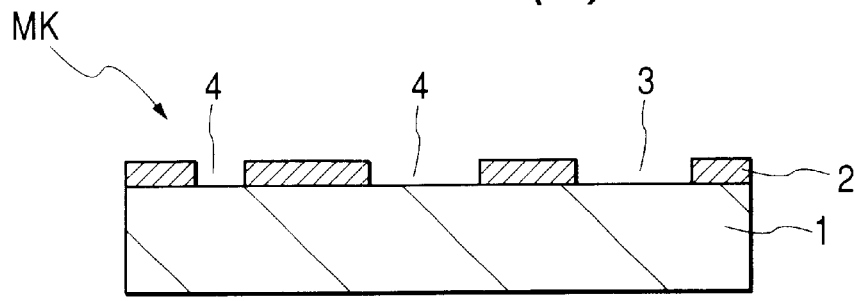
FIG. 20(b) is a cross-sectional view taken along the line A8—A8 of FIG. 20(a).

FIG. 19 is a plan view of a portion of the wafer W, including the hole pattern H formed by using the mask of this embodiment. FIGS. 20(a) and 20(b) illustrate an example of the mask MK used to form the hole pattern H of this embodiment. FIG. 20(a) is a plan view of a portion of the mask MK, while FIG. 20(b) is a cross-sectional view taken along the line A8—A8 of FIG. 20(a).

In this example, the hole pattern H is not allocated at the intersecting points P5 of the virtual lines Xw, Yw on the wafer W. In the mask MK of FIG. 20(a), the auxiliary apertures 4 (4a1, 4a2) are allocated at positions corresponding to the intersecting point PS on the wafer W of FIG. 19. This auxiliary aperture 4a1 represents the aperture pattern before the proximity correction, while the auxiliary aperture 4a2 represents the aperture pattern after the proximity correction. An OPC value Δdopc (Left) for the auxiliary aperture 4a1 can be obtained by accumulating the correction values determined with the relative positions of the respective intersecting points P5, P6, P7, P8 depending on the existence and non-existence of the hole pattern at the intersecting points P6, P7, P8 of the virtual lines Xw, Yw on the wafer W of FIG. 19. In this example, the hole pattern is not allocated at the intersecting points P6, P7, and the respective correction values are accumulated. The size of the auxiliary aperture 4a2 after the proximity correction is a little larger than that before the correction. With this correction, the auxiliary aperture 4 in the periphery of the main aperture 3 to form the hole pattern becomes larger in the coarse region, and the difference between the coarse and fine regions may be reduced. Moreover, a margin for the non-resolution of the auxiliary aperture 4 in the fine region can also be improved because the auxiliary aperture 4 in the fine region becomes relatively small.

As a modification, for example, in this embodiment 3, the half-tone film 2 of the mask MK may be replaced with a light shielding film, for example, in the form of a discrete film of chromium or a laminated film of chromium and chromium oxide. Moreover, it is also possible to combine this modification with the modification explained in the embodiment 2. In this case, the effect as explained above can also be obtained.

Embodiment 4

In this embodiment, an example of how to allocate the auxiliary apertures on the mask will be explained.

Figure 21:
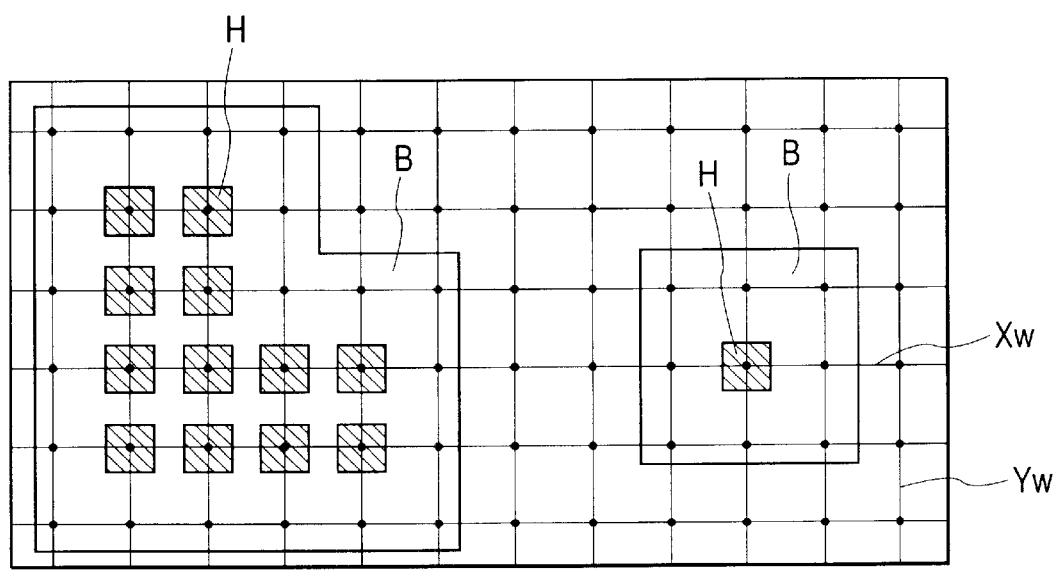
FIG. 21 is a diagram illustrating a method of allocating a pattern on a photomask according to an embodiment of the present invention.

FIG. 21 schematically illustrates the design data of the hole pattern H, showing an example of allocation of the hole pattern H in the coarse region (right side of FIG. 21) and the fine region (left side of FIG. 21). The hole pattern H is allocated at the intersecting points of the virtual lines Xw, Yw.

In this embodiment, the intersecting points surrounding those intersecting points where the hole pattern H is allocated are defined as the allocation region B (hatched region) of the auxiliary aperture on the mask, and the auxiliary apertures are allocated at the intersecting points where the hole pattern H is not allocated in this allocation region B. This allocation region B is automatically formed by broadening the hole pattern H up to two times the pattern pitch.

Figure 22A:
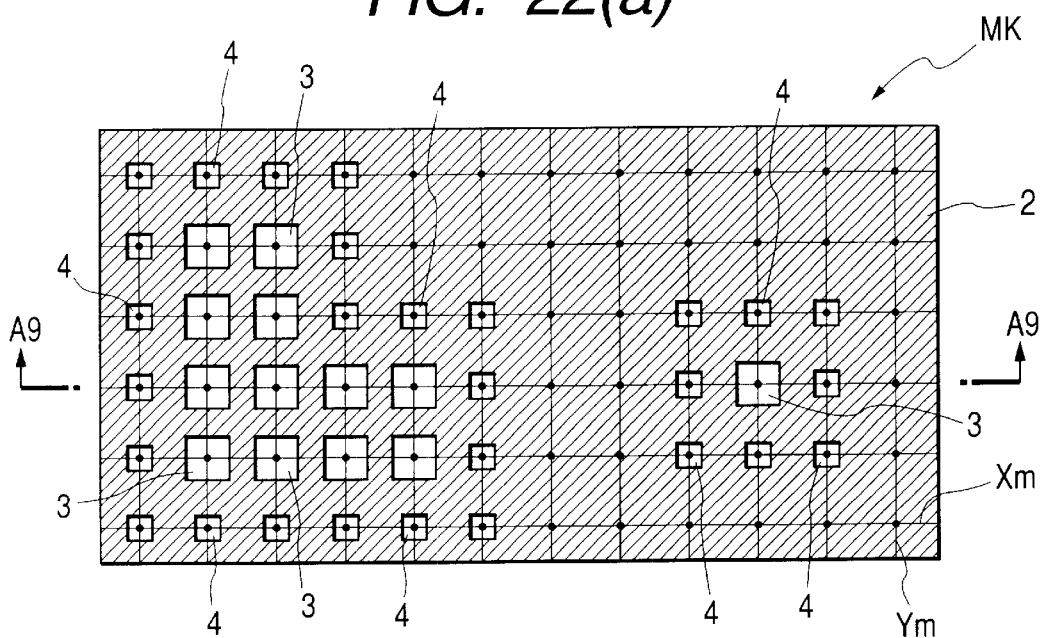
FIG. 22(a) is a plan,view of a portion of the photomask on which a pattern is allocated depending on the allocation method of FIG. 21.
Figure 22B:
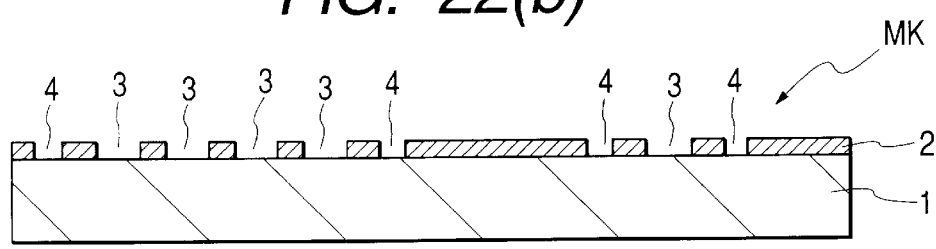
FIG. 22(b) is a cross-sectional view taken along the line A9—A9 of FIG. 22(a).

FIGS. 22(a) and 22(b) illustrate the mask MK generated with the allocation method explained above. FIG. 22(a) is a plan view of a portion of the mask MK and FIG. 22(b) is a cross-sectional view taken along the line A9—A9 of FIG. 22(a). The auxiliary apertures 4 are allocated so as to surround the area of the main apertures 3 along the boundary of the intersecting points of the virtual lines Xm, Ym around the area of the main apertures 3 to transfer the hole pattern H.

As explained above, the effective region of the auxiliary apertures 4 is determined and the auxiliary apertures 4 are allocated therein. Thereby, the formation of useless auxiliary apertures 4 can be prevenetd. Therefore, it is also possible to prevent depiction of a useless pattern at the time of fabricating the mask. Accordingly, the pattern depicting time of the mask MK can be shortened, and, thereby, the mask MK manufacturing time can also be shortened. As a result, the development period and manufacturing period of a semiconductor IC device can be shortened.

Such method of allocation of the auxiliary apertures on the mask can also be applied to a mask utilizing a discrete film of chromium, or a laminated layer film of chromium and chromium oxide or the like, as the light shielding film. Moreover, it is also possible to combine this method with the modifications explained in connection with the embodiments 2 and 3. When these are combined, a similar effect can also be attained.

Embodiment 5

In this embodiment, a part of the allocation of the virtual lines is deviated.

Figure 23:
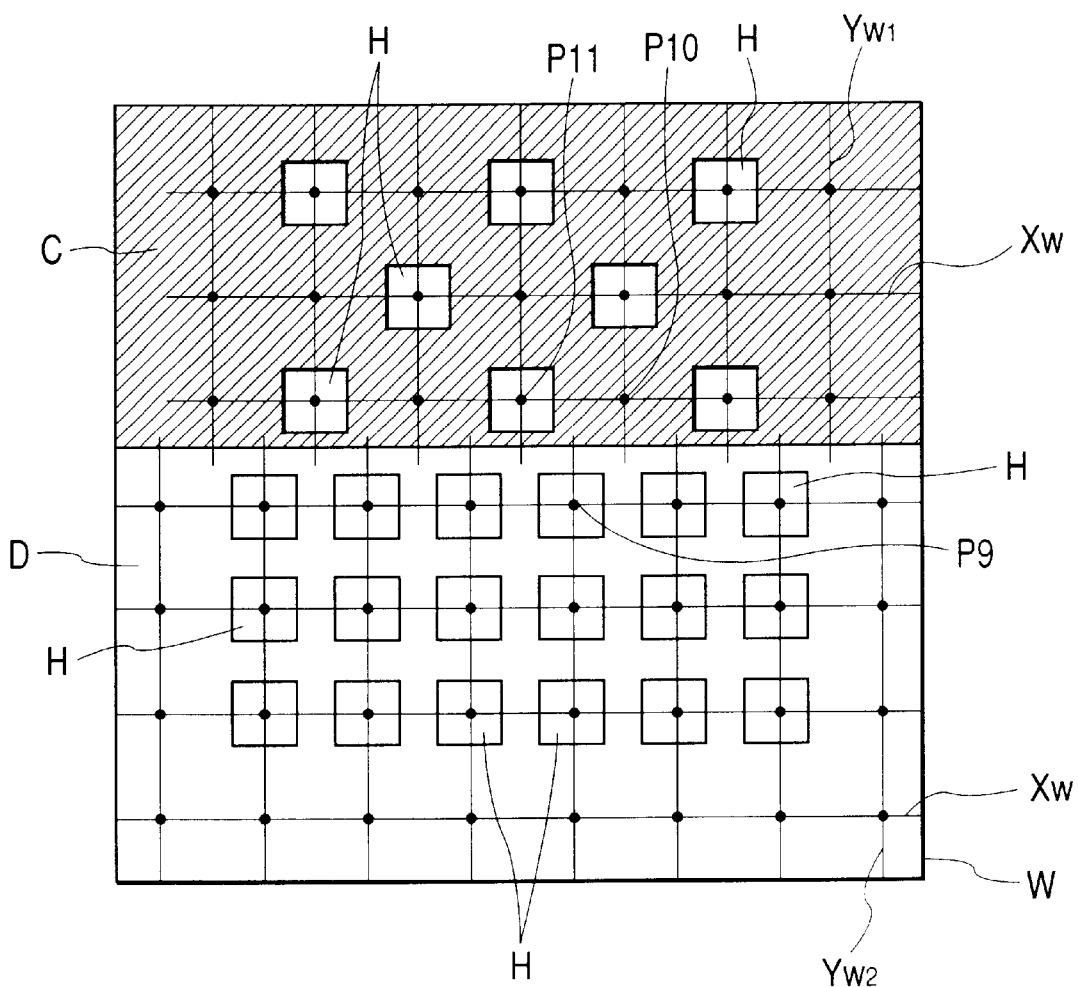
FIG. 23 is a plan view of a portion of a wafer, including hole patterns formed using the photomask according to another embodiment of the present invention.

FIG. 23 is a plan view of a portion of the wafer W where a plurality of hole patterns H are allocated. In the regions C, D of wafer W, the virtual line Xw is allocated in the same pitch without any deviation. However, the virtual line Yw1 in the region C is provided with the same interval as the virtual line Yw2 in the region D, but the pitch thereof is deviated by a half-pitch from that of the virtual line Yw2.

Figure 24A:
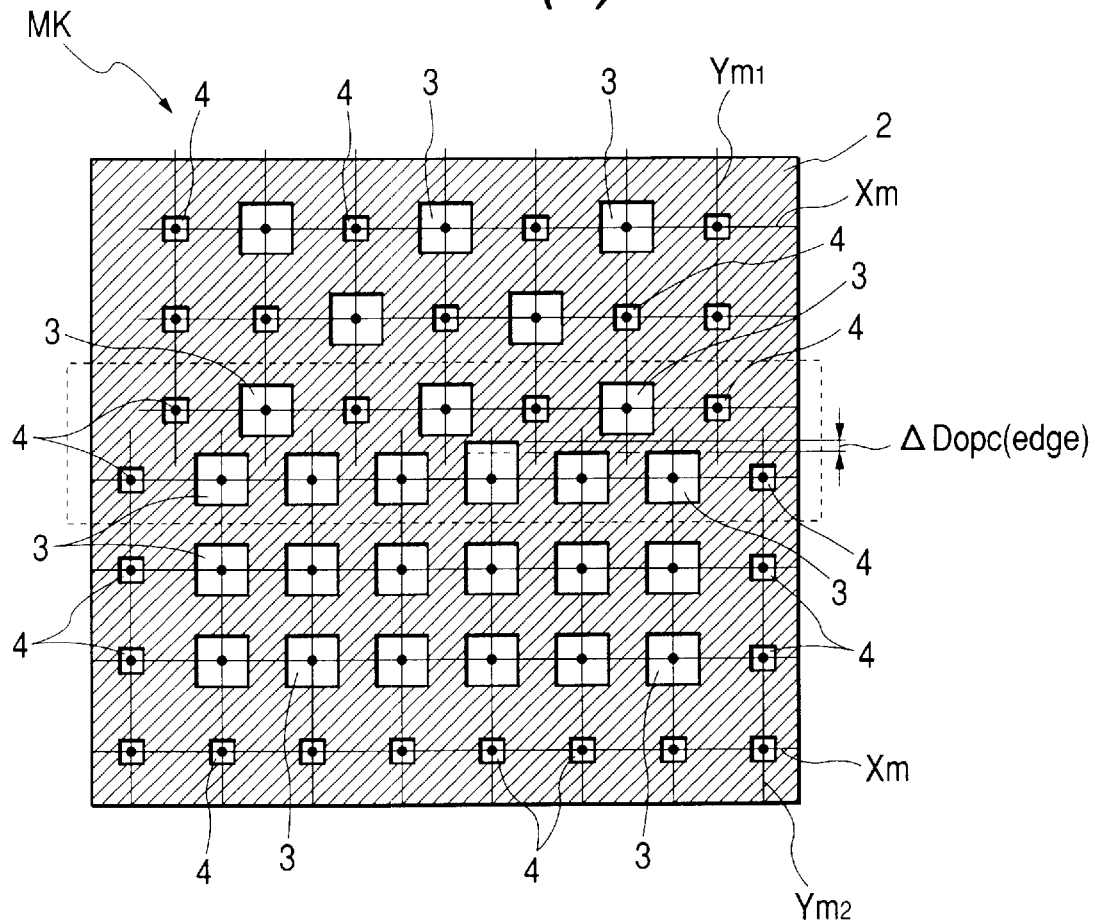
FIG. 24(a) is a plan view of a portion of an example of the photomask used to form the hole patterns of FIG. 23.
Figure 24B:
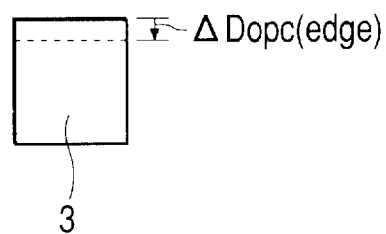
FIGS. 24(b) and 24(c) are diagrams indicating correction for the main aperture 3 when the pattern allocation is fine and coarse.
Figure 24C:
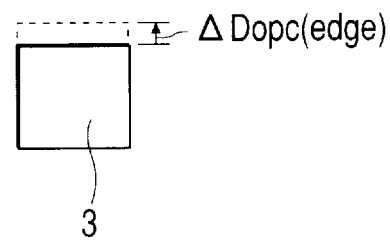

FIG. 24(a) is a plan view of a portion of mask MK in the case of transferring the hole pattern of FIG. 23. FIGS. 24(b) and 24(c) are diagrams showing correction of the main aperture 3 in the cases where the pattern allocation is fine and coarse. The cross-section of the mask MK is identical to that explained above. The virtual lines Ym1, Ym2 are also deviated by a half-pitch.

In this case, it is also preferable to perform a proximity correction as explained with reference to embodiments 2, 3 for the apertures (main aperture 3 and auxiliary aperture 4) allocated in the region corresponding to the boundary region of the regions C and D of FIG. 23. Correction for the apertures at the boundary region is different from that for the apertures (main aperture 3 and auxiliary aperture 4) allocated in the region other than the boundary region above. For example, the OPC value ?Dopc (edge) of the main aperture 3 in the mask MK to form the hole pattern H allocated at the intersecting point P9 of the virtual lines Xw and Yw2 on the wafer, for example, at the boundary region, can be obtained by accumulating the correction determined from the relative positions of the intersecting points P9, P10, P11 depending on the existence or non-existence of the hole patterns at the intersecting points P10, P11 of the virtual lines Xw, Yw1 on the wafer. In the case where the hole pattern H is about a half of the pattern pitch (in the case of fine allocation), the value of ΔDopc (edge) is preferably smaller than the OPC value in the region other than the boundary region described above (FIG. 24(b)). Moreover, when the pitch in the X direction of the hole pattern H is large (coarse allocation), it is preferable that the value of ΔDopc (edge) is identical to or larger than the OPC value of the region other than the boundary region (FIG. 24(c)). The OPC value is also determined in the same manner for the auxiliary apertures 4. In FIG. 24(a), an example where correction is executed only for one main aperture 3 is illustrated, but in actual practice, the correction is also executed for the main apertures 3 and auxiliary apertures 4 in the boundary region (region surrounded with a broken line).

Thereby, even if there is a deviation in the pattern allocation, the pattern transfer may be performed accurately. Therefore, this embodiment can be applied to the actual pattern transfer of the semiconductor IC device. Moreover, this embodiment assures improvement in reliability and manufacturing yield of the semiconductor IC device.

A method of covering such pattern deviation can also be applied to the mask using, as the light shielding film, a discrete film of chromium or a laminated film of chromium and chromium oxide or the like. Moreover, it is also possible to combine this embodiment with the previously described modifications of the embodiments 2 to 4. In this case, a similar effect can also be attained.

Embodiment 6

In this embodiment, an example where the vertical and lateral pitches of the virtual lines are different will be explained.

Figure 25:
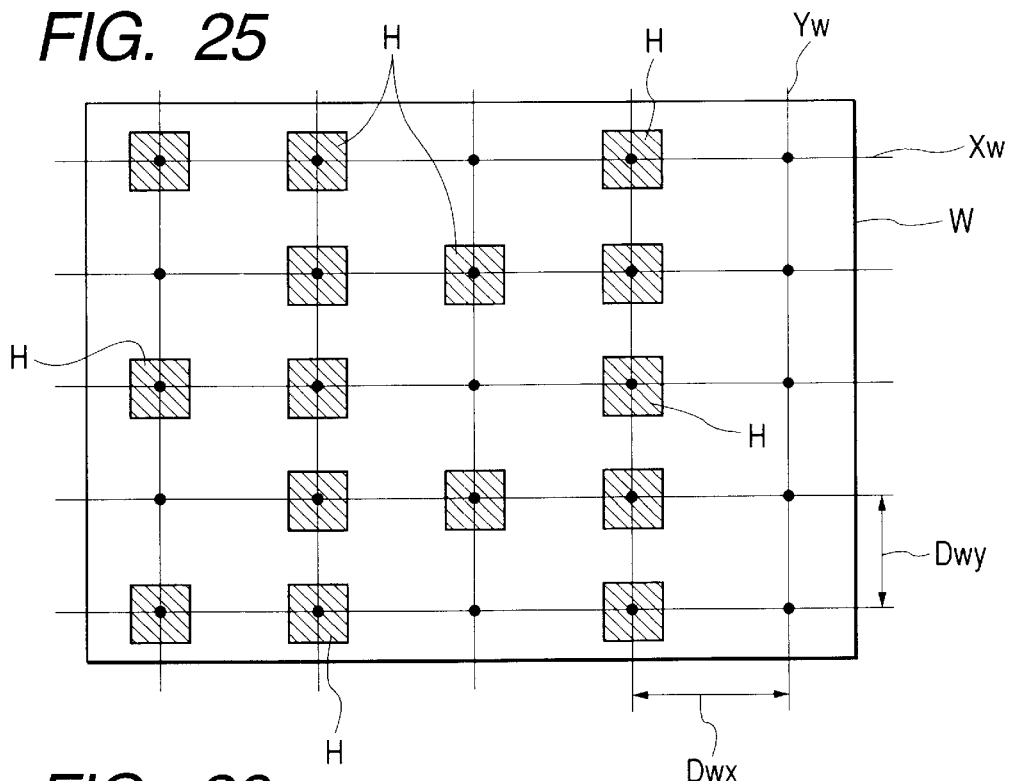
FIG. 25 is a plan view of a portion of the wafer, including hole patterns formed using the photomask according to another embodiment of the present invention.
Figure 26:
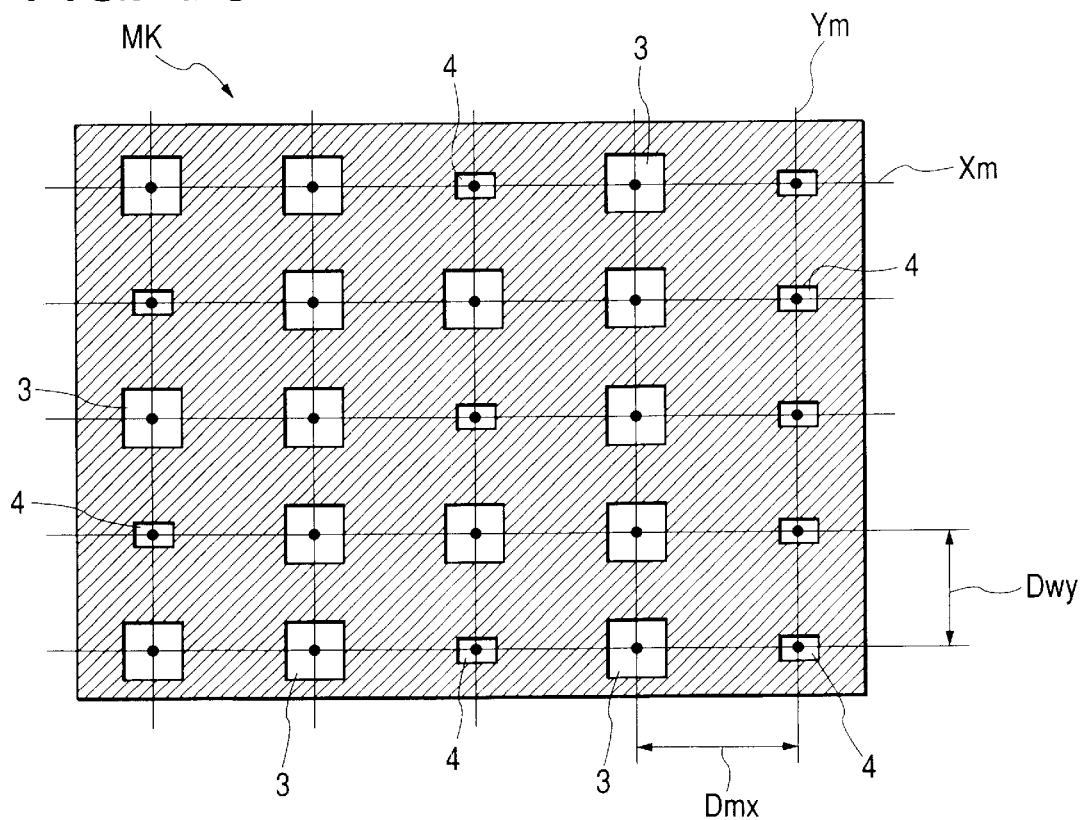
FIG. 26 is a plan view of a portion of an example of the photomask used to form the hole patterns of FIG. 25.
Figure 27:
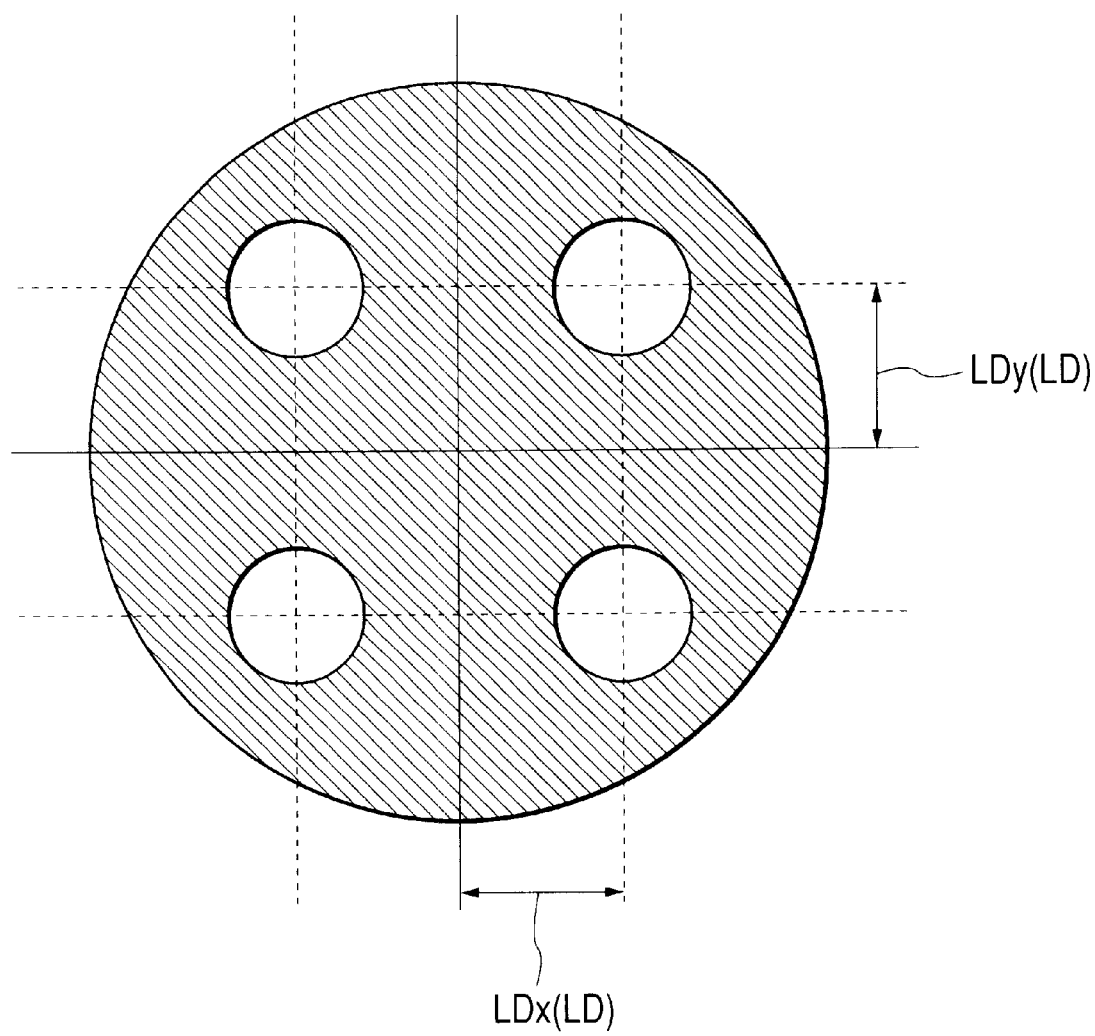
FIG. 27 is a plan view of an example of the lighting system of the aligner used to transfer the hole patterns of FIG. 25.

FIG. 25 is a plan view of a portion of the wafer W. Here, the pitches Dwy, Dwx of the virtual lines Xw, Yw are different, and the pitch Dwx is longer than the pitch Dwy. Moreover, FIG. 26 is a plan view of a portion of the mask MK in the case of FIG. 25. The pitches Dmy, Dmx of the virtual lines Xm, Ym are different, and the pitch Dmx is longer than the pitch Dmy. Moreover, FIG. 27 illustrates 4-aperture lighting as an example of the lighting system of the aligner used in this case. The distance LD from the optical axis of the center of the aperture in the 4-aperture lighting is as described above. Here, the vertical and lateral pitches Dwx, Dwy of the virtual lines can be determined independently, and the optimum values of the distances LDx, Ldy from the optical axis of the center of aperture in the 4-aperture lighting can also be determined depending on the respective pitches. In FIG. 27, the distances LDx, Ldy are different, and the distance LDy is longer than the distance LDx.

Moreover, in this case, the proximity correction is also conducted independently in the vertical and lateral directions of the virtual lines Xm, Ym. As illustrated in FIG. 25, when the lateral pitch Dxw is larger and the desired hole pattern H has the same size in the vertical and lateral directions, it is preferable that the proximity correction value in the vertical direction is set to be larger than that in the lateral direction.

Thereby, accurate pattern transfer can be realized even when the vertical and lateral pitches of the virtual lines are different. Therefore, the method of this embodiment can also be adapted to the actual pattern transfer of a semiconductor IC device. In addition, the reliability and manufacturing yield of the semiconductor IC device can be improved.

The method for covering such difference of the vertical and lateral pitches of the virtual lines can also be applied to a mask using, as the light shielding film, a discrete film of chromium, or a laminated layer film of chromium and chromium oxide or the like. In addition, it is also possible to combine this method with the previously described modifications of embodiments 2 to 5. In such a case, a similar effect can also be attained.

The present invention has been described practically based on the preferred embodiments thereof, but the present invention is not limited only to the embodiments explained above and various changes or modifications are permitted without departing from the scope of the claims thereof.

For example, in above-described embodiments, a crown type capacitor is used, for the memory cell of DRAM, but the present invention is not limited thereto and allows various changes. For example, it is also possible use a fin type capacitor.

Moreover, in above embodiments, an ordinary wiring structure is used but the present invention is not limited thereto. For example, the present invention can also be adapted to the so-called Damascene wiring structure for the wiring and plug, for example, by embedding the conductor film into the groove or hole bored in the insulation film.

In above explanation, the present invention has been adapted to the manufacture of a semiconductor IC device including CMIS-logic or a semiconductor IC device including a DRAM-logic hybrid circuit as the typical application field thereof, but the present invention is not limited thereto and can also be applied to the manufacture of a semiconductor IC device including a memory circuit, such as a SRAM (Static Random Access Memory) or flash memory (EEPROM: Electric Erasable Programmable Read Only Memory) or the like, a semiconductor IC device including a logic circuit, such as a microprocessor or the like, and a hybrid type semiconductor IC device providing a memory circuit and logic circuit on the same semiconductor substrate.

The representative effects of the present invention will be summarized as follows.

(1) According to the present invention, the resolution of a predetermined pattern can be improved, on the occasion of the aligning process to transfer the predetermined pattern to a semiconductor wafer by irradiating the photoresist film on the semiconductor wafer with an aligning laser beam of the modified lighting via the photomask, utilizing a photomask thereof, by allocating, to provide a periodicity, main apertures to transfer the predetermined pattern as apertures formed by removing a part of the half-tone film on the mask substrate and auxiliary apertures not resolved on the semiconductor wafer as apertures formed by removing a part of the half-tone film.

(2) According to the present invention, on the occasion of the aligning process to transfer a predetermined pattern to a semiconductor wafer by irradiating a photoresist film on the semiconductor wafer using an aligning laser beam of modified lighting via a photomask, the pattern size difference in the coarse region where the predetermined patterns are allocated in the relatively coarse condition and the fine region where the predetermined patterns are allocated in the relatively fine condition can be reduced by utilizing the photomask thereof allocating, to provide a periodicity, main apertures to transfer the predetermined pattern as apertures formed by removing a part of the half-tone film on the mask substrate and auxiliary apertures not resolved on the semiconductor wafer as apertures formed by removing a part of the half-tone film.

(3) According to the present invention, on the occasion of the aligning process to transfer a predetermined pattern to a semiconductor wafer by irradiating a photoresist film on the semiconductor wafer using an aligning laser beam of modified lighting via a photomask, the size accuracy of a pattern existing at the boundary of a coarse region where the predetermined patterns are allocated in a relatively coarse condition and a fine region where the predetermined patterns are allocated in a relatively fine condition can be improved by utilizing the photomask thereof, allocating, to provide periodicity, main apertures to transfer the predetermined pattern as apertures formed by removing a part of the half-tone film on the mask substrate and auxiliary apertures not resolved on the semiconductor wafer as apertures formed by removing a part of the half-tone film.

What is claimed is:

1. Method for manufacturing a semiconductor IC device, comprising the steps of:
   (a) depositing a photoresist over a semiconductor wafer so as to form a photoresist film; and
   (b) transferring an integrated circuit pattern over a photomask to the semiconductor wafer by irradiating the photoresist film over said semiconductor wafer with an off-axis illumination through an optical reduction projection system,
   wherein said photomask comprises:
      (i) a mask substrate;
      (ii) a halftone film over a main surface of the mask substrate;
      (iii) a plurality of main apertures in the halftone film to transfer the integrated circuit pattern corresponding to a plurality of hole patterns having substantially a same size over the wafer; and
      (iv) a plurality of auxiliary apertures in the halftone film not resolved over said semiconductor wafer,
      wherein said main apertures and said auxiliary apertures are disposed periodically as a whole.

2. Method for manufacturing a semiconductor IC device according to claim 1, wherein said main apertures and said auxiliary apertures are disposed at intersecting points of first and second virtual lines perpendicularly crossing with each other.

3. Method for manufacturing a semiconductor IC device according to claim 2, wherein pitches of said first and second virtual lines are identical in first and second regions over the main surface of said photomask, and positions of said first and second virtual lines in said first and second regions are shifted from each other.

4. Method for manufacturing a semiconductor IC device according to claim 2, wherein said first virtual lines are different from said second virtual lines in their pitches.

5. Method for manufacturing a semiconductor IC device according to claim 4, wherein a type of said off-axis illumination is chosen in accordance with the pitches of the first and second virtual lines.

6. Method for manufacturing a semiconductor IC device according to claim 2, wherein said main apertures and said auxiliary apertures are disposed at the intersecting points of said first and second virtual lines in a first region, while said main apertures and said auxiliary apertures are disposed off the intersecting points in a second region.

7. Method for manufacturing a semiconductor IC device according to claim 1, wherein a proximity correction is applied to first main apertures, of said main apertures, or to first auxiliary apertures, of said auxiliary apertures.

8. Method for manufacturing a semiconductor IC device according to claim 1, wherein said auxiliary apertures are disposed around a densely disposed region of said main apertures.

9. Method for manufacturing a semiconductor IC device according to claim 1, wherein said off-axis illumination is a quadrupole illumination or an annular illumination.

10. Method for manufacturing a semiconductor IC device according to claim 1, wherein the photomask has a dense region and a diffused region where the main apertures are disposed respectively in a higher density and lower density.

11. Method for manufacturing a semiconductor IC device, comprising the steps of:
    (a) depositing a photoresist over a semiconductor wafer so as to form a photoresist film; and
    (b) transferring an integrated circuit pattern over a photomask to the semiconductor wafer by irradiating the photoresist film over said semiconductor wafer with an off-axis illumination through an optical reduction projection system,
    wherein said photomask comprises:
        (i) a mask substrate;
        (ii) a halftone film over a main surface of the mask substrate;
        (iii) a plurality of main apertures in the halftone film to transfer the integrated circuit pattern corresponding to a plurality of hole patterns having substantially a same size over the wafer; and
        (iv) a plurality of auxiliary apertures in the halftone film not resolved over said semiconductor wafer,
        wherein said main apertures and said auxiliary apertures are disposed periodically as a whole, and a proximity correction is applied to at least one of first main apertures of said main apertures and first auxiliary apertures of said auxiliary apertures.

12. Method for manufacturing a semiconductor IC device according to claim 11, wherein said main apertures and said auxiliary apertures are disposed at intersecting points of first and second virtual lines perpendicularly crossing with each other.

13. Method for manufacturing a semiconductor IC device according to claim 12, wherein pitches of said first and second virtual lines in first and second regions over the main surface of said photomask are identical and positions of said first and second virtual lines in said first and second regions are shifted from each other.

14. Method for manufacturing a semiconductor IC device according to claim 12, wherein said first virtual lines are different from said second virtual lines in their pitches.

15. Method for manufacturing a semiconductor IC device according to claim 14, wherein a type of said off-axis illumination is chosen in accordance with the pitches of the first and second virtual lines.

16. Method for manufacturing a semiconductor IC device according to claim 12, wherein the said main apertures and said auxiliary apertures are disposed at the intersecting points of said first and second virtual lines in a first region, while said main apertures and said auxiliary apertures are disposed off the intersecting points in a second region.

17. Method for manufacturing a semiconductor IC device according to claim 12, wherein said auxiliary apertures are disposed around a densely disposed region of the said main apertures.

18. Method for manufacturing a semiconductor IC device according to claim 12, wherein said off-axis illumination is quadrupole illumination or annular illumination.

19. Method for manufacturing a semiconductor IC device according to claim 12, wherein the main surface of the mask substrate has a dense region and a diffused region where the main apertures are disposed respectively in a higher density and a lower density.

20. Method for manufacturing a semiconductor IC device, comprising the steps of:
    (a) depositing a photoresist over a semiconductor wafer so as to form a photoresist film; and
    (b) transferring an integrated circuit pattern over a photomask to the semiconductor wafer by irradiating the photoresist film over said semiconductor wafer with an off-axis illumination through an optical reduction projection system,
    wherein said photomask comprises:
        (i) a mask substrate;
        (ii) a halftone film over a main surface of the mask substrate;
        (iii) a plurality of main apertures in the halftone film to transfer the integrated circuit pattern corresponding to a plurality of hole patterns having substantially a same size over the wafer; and
        (iv) a plurality of auxiliary apertures in the halftone film not resolved over semiconductor wafer,
        wherein said main apertures and said auxiliary apertures are disposed periodically as a whole; and said auxiliary apertures are disposed in a region which is broadened for a length of integer times a pitch of said integrated circuit pattern with reference to said main apertures.

21. Method for manufacturing a semiconductor IC device according to claim 20, wherein said main apertures and said auxiliary apertures are disposed at intersecting points of first and second virtual lines crossing perpendicularly with each other.

22. Method for manufacturing a semiconductor IC device according to claim 21, wherein pitches of said first and second virtual lines are different for every region over the main surface of said photomask.

23. Method for manufacturing a semiconductor IC device according to claim 21, wherein said first virtual lines are different from said second virtual lines in their pitches.

24. Method for manufacturing a semiconductor IC device according to claim 23, wherein a type of said off-axis illumination is chosen in accordance with the pitches of the first and second virtual lines.

25. Method for manufacturing a semiconductor IC device according to claim 21, wherein said main apertures and said auxiliary apertures are disposed at the intersecting points of said first and second virtual lines in a first region, while said main apertures and said auxiliary apertures are disposed off the intersecting points in a second region.

26. Method for manufacturing a semiconductor IC device according to claim 20, wherein said off-axis illumination is quadrupole illumination or annular illumination.

27. Method for manufacturing a semiconductor IC device according to claim 20, wherein the main surface of the mask substrate has a dense region and a diffused region where the main apertures are disposed respectively in a higher density and a lower density.

* * * * *